(12) United States Patent
Okita et al.

(10) Patent No.: US 8,563,332 B2
(45) Date of Patent: Oct. 22, 2013

(54) WAFER RECLAMATION METHOD AND WAFER RECLAMATION APPARATUS

(75) Inventors: Shogo Okita, Hyogo (JP); Gaku Sugahara, Nara (JP); Hiroyuki Suzuki, Osaka (JP); Ryuzou Houchin, Osaka (JP); Mitsuru Hiroshima, Osaka (JP)

(73) Assignee: Panasonic Corporation, Osaka (JP)

( * ) Notice: Subject to any disclaimer, the term of this patent is extended or adjusted under 35 U.S.C. 154(b) by 424 days.

(21) Appl. No.: 12/676,186

(22) PCT Filed: Aug. 25, 2008

(86) PCT No.: PCT/JP2008/002285
§ 371 (c)(1),
(2), (4) Date: Mar. 3, 2010

(87) PCT Pub. No.: WO2009/031270
PCT Pub. Date: Mar. 12, 2009

(65) Prior Publication Data
US 2010/0173431 A1 Jul. 8, 2010

(30) Foreign Application Priority Data

Sep. 3, 2007 (JP) .................................. 2007-228387
May 22, 2008 (JP) .................................. 2008-133711

(51) Int. Cl.
*H01L 21/31* (2006.01)
*H01L 21/3065* (2006.01)

(52) U.S. Cl.
USPC ........................................ 438/4; 257/E21.24

(58) Field of Classification Search
None
See application file for complete search history.

(56) References Cited

U.S. PATENT DOCUMENTS

| 4,912,063 | A * | 3/1990 | Davis et al. ................... 117/97 |
| 6,384,415 | B1 | 5/2002 | Suzuki et al. |
| 6,613,676 | B1 | 9/2003 | Yonehara et al. |
| 2001/0039101 | A1 | 11/2001 | Wenski |
| 2005/0064723 | A1 * | 3/2005 | Sumakeris ................... 438/757 |
| 2008/0318343 | A1 * | 12/2008 | Vepa et al. ........................ 438/4 |

FOREIGN PATENT DOCUMENTS

| JP | 52-131471 | 11/1977 |
| JP | 08-167587 | 6/1996 |
| JP | 10-209117 | 8/1998 |
| JP | 11-288858 | 10/1999 |
| JP | 2001-044153 | 2/2001 |
| JP | 2001-358107 | 12/2001 |
| JP | 2002-26096 | 1/2002 |
| JP | 2003-260641 | 9/2003 |
| JP | 3596363 | 9/2004 |

OTHER PUBLICATIONS

International Search Report of PCT/JP2008/002285, dated Sep. 22, 2008.

* cited by examiner

*Primary Examiner* — Seahvosh Nikmanesh
(74) *Attorney, Agent, or Firm* — Hamre, Schumann, Mueller & Larson, P.C.

(57) ABSTRACT

Provided is a wafer reclamation method for reclaiming a semiconductor wafer, on which a different material layer is formed, by removing the different material layer. The wafer reclamation method includes a physically removing step of physically removing the different material layer, a film forming step of forming a film on a surface of the semiconductor wafer from which the different material layer has been removed in the physically removing step, and a dry etching step of etching the semiconductor wafer by plasma together with the film formed in the film forming step.

9 Claims, 21 Drawing Sheets

| PROCESSING | [RESIST FILM FORMATION + DRY ETCHING] ONE TIME | [RESIST FILM FORMATION + DRY ETCHING] TWICE |
|---|---|---|
| CHARACTERISTIC | Si rate = 9389A/min<br>PR rate = 9418A/min<br>Si/PR = 0.997 | Si rate = 9389A/min<br>PR rate = 9418A/min<br>Si/PR = 0.997 |
| SURFACE ROUGHNESS (Ra) | 26.9 Å | 14.6~21.4 Å |
| WAFER SURFACE (PLAN VIEW) | ×5 | ×5<br>※Ra FURTHER IMPROVED BY PERFORMING PROCESSING TWICE |

FIG. 12B  ETCHING CONDITION

| SF6(sccm) | 100 |
|---|---|
| CF4(sccm) | 0 |
| Ar(sccm) | 20 |
| Pre.(Pa) | 0.7 |
| ICP(W) | 1000 |
| Bias(W) | 400 |
| ESC(kV) | ±1.2 |
| He(Pa/sccm) | 1200Pa/10cc |
| Top(°C) | 100 |
| Wall(°C) | 100 |
| Stage(°C) | 20 |
| Time(min) | 8 |

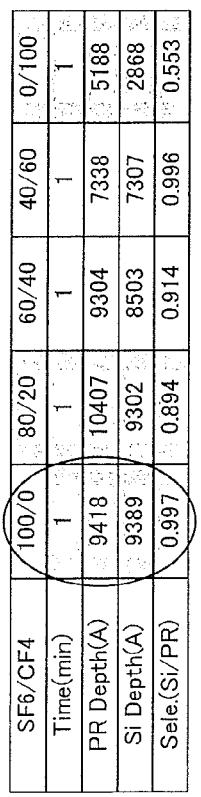
FIG. 13A
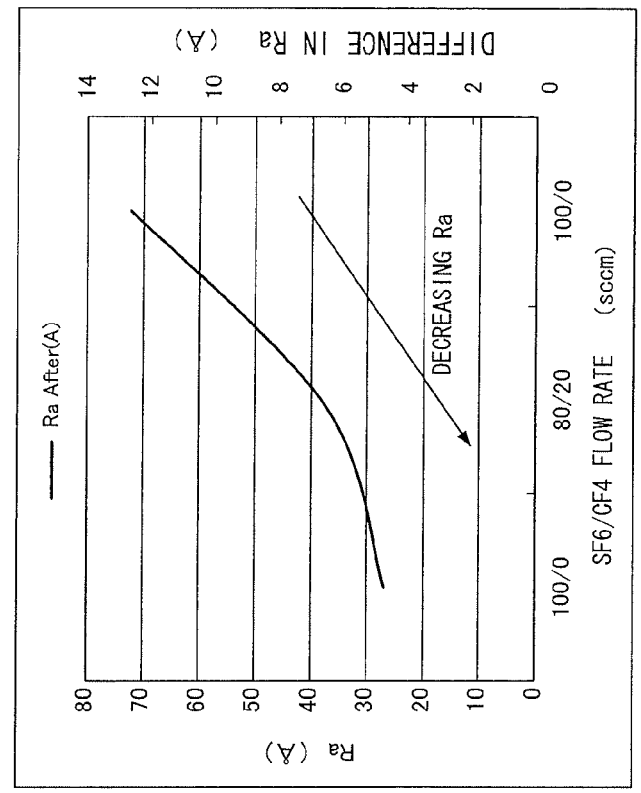
FIG. 13B
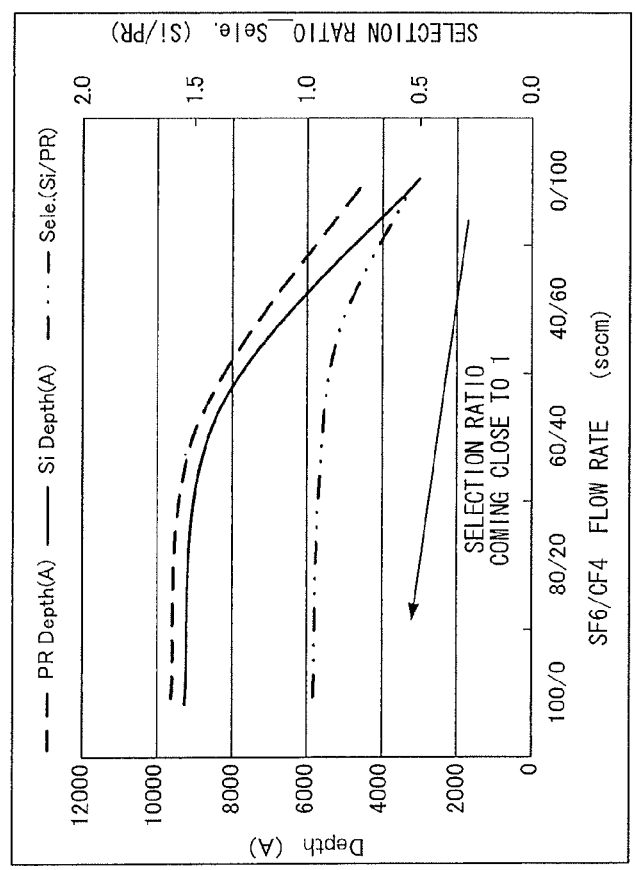
FIG. 13C  ETCHING CONDITION

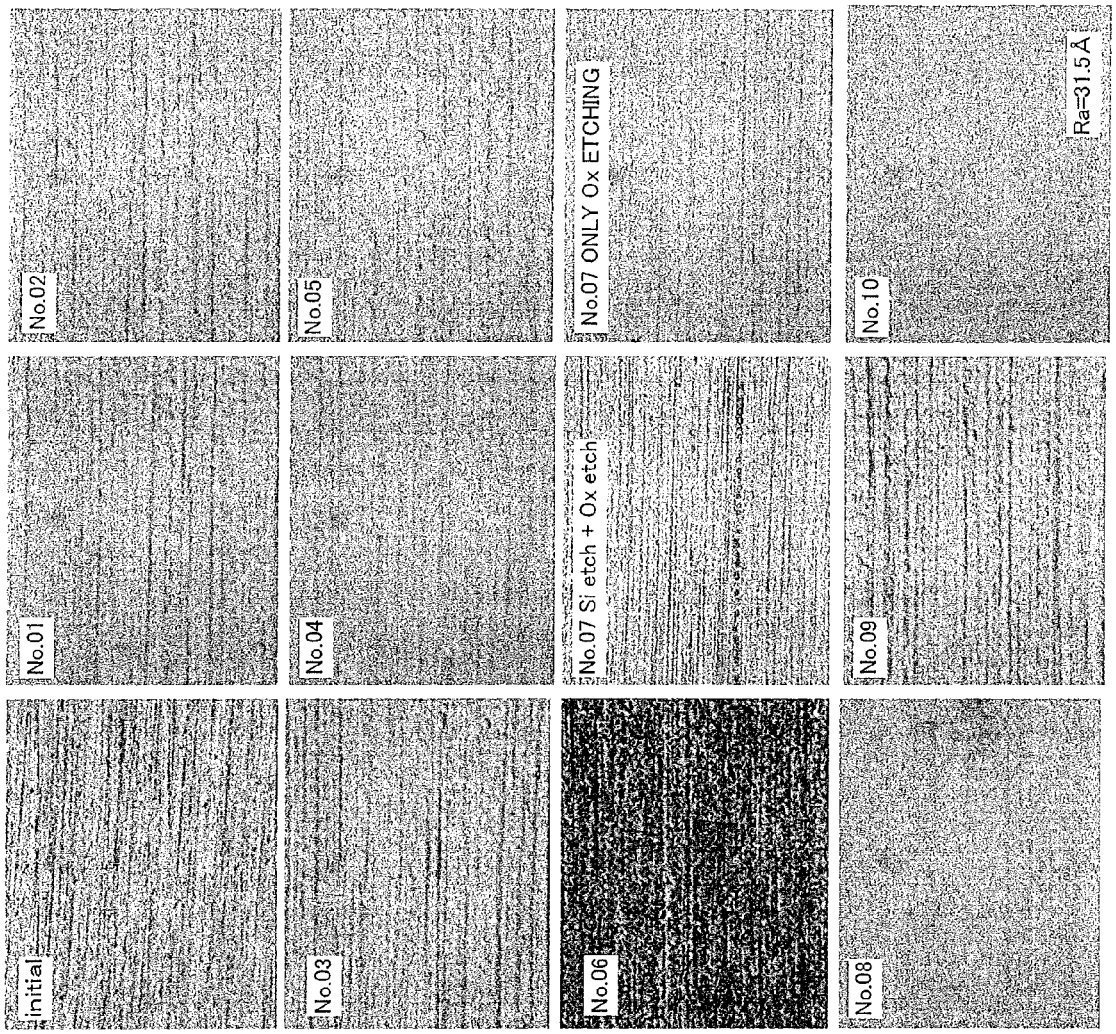

NUMBER OF TIMES OF [RESIST FILM FORMATION + DRY ETCHING] AND
WAFER SURFACE ROUGHNESS (Ra) AFTER GRINDING

UNIT : Å

| SAMPLE No.<br>NUMBER OF<br>TIMES OF<br>PROCESSING | G001 | G002 | G003 | G004 | G005 |
|---|---|---|---|---|---|
| 0 | 133.1 | 111.8 | 130.7 | 132.6 | 200.9 |
| 1 | 48.0 | 69.8 | 45.7 | 41.1 | 48.0 |
| 2 |  | 19.8 | 27.0 | 32.7 | 27.7 |
| 3 |  |  | 15.6 | 15.0 | 14.4 |
| 4 |  |  |  | 12.1 | 12.2 |

NUMBER OF TIMES OF PROCESSING

RESIST FILM FORMATION + DRY ETCHING

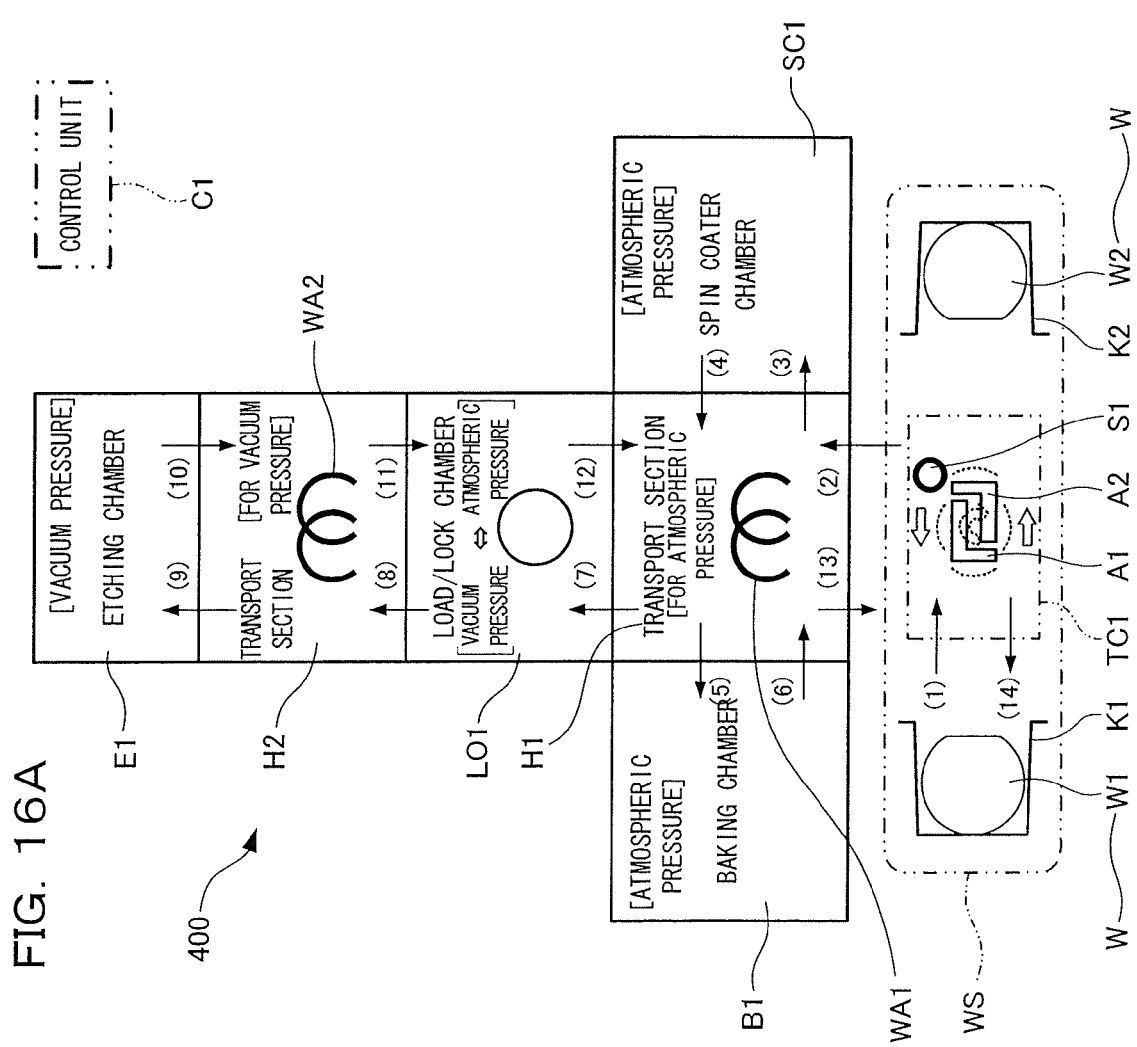

OR1

200 WAFER W

N1

200 WAFER W

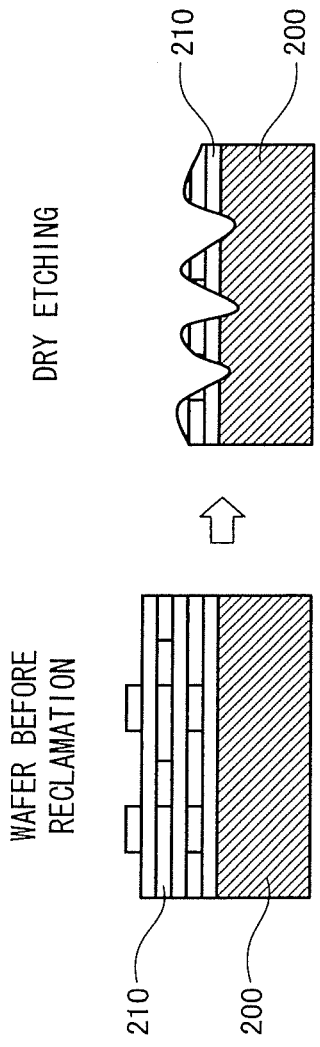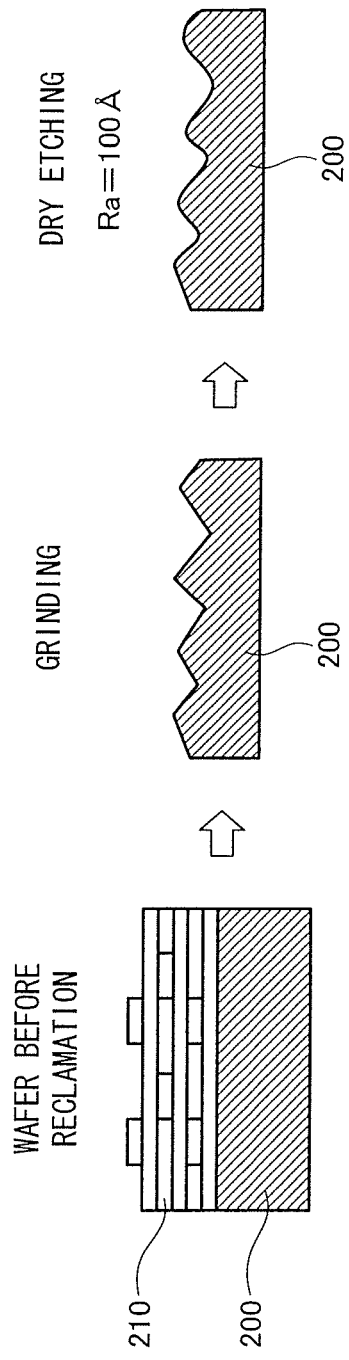
FIG. 20A DIRECT DRY ETCHING ON WAFER BEFORE RECLAMATION
FIG. 20B ONLY DRY ETCHING AFTER GRINDING OF WAFER BEFORE RECLAMATION

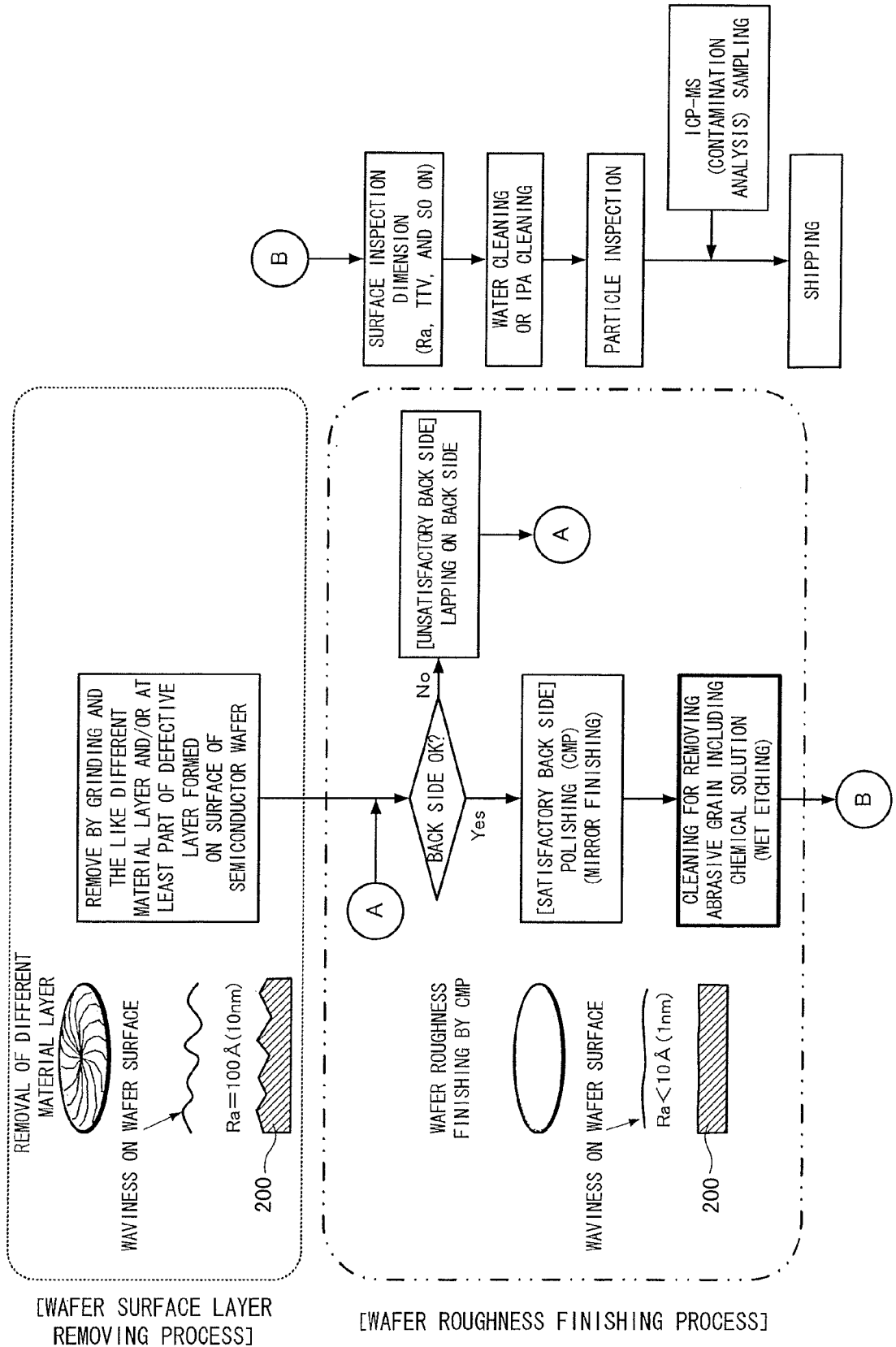

WAFER RECLAMATION METHOD AND WAFER RECLAMATION APPARATUS

TECHNICAL FIELD

The present invention relates to a wafer reclamation technique for reclaiming a wafer being processed, which is a semiconductor wafer found defective in the manufacturing process of a semiconductor device, such that the semiconductor wafer is identical to an initial semiconductor wafer having not undergone the manufacturing process of a semiconductor circuit yet.

BACKGROUND ART

In the manufacturing of an IC (Integrated Circuit), various layers are formed on a surface of a thin semiconductor wafer shaped like a disk (hereinafter may be called an "initial wafer") and a formed film is partially etched to form a number of circuit patterns on the semiconductor wafer (hereinafter may be called a "wafer" (or may be called a semiconductor substrate)).

In this manufacturing process of a semiconductor device, when a semiconductor wafer is found defective in the step of forming any one of the layers or in the etching step of removing a part of the layers, the semiconductor wafer is not transported to the subsequent manufacturing process and is discarded as a defective semiconductor wafer (hereinafter, may be called a "wafer being processed").

The defective wafer being processed is discarded but the semiconductor wafer itself is not defective except for the layers formed on the surface. Thus by removing the layers formed in the manufacturing process of a semiconductor and smoothing the surface condition of the semiconductor wafer, the semiconductor wafer can be reclaimed to be identical to an initial wafer (hereinafter may be called a "reclaimed wafer").

A reclamation method of a semiconductor wafer according to the prior art is described in, for example, Japanese Patent Laid-Open No. 2001-358107. The disclosed wafer reclamation method includes: (a) surface grinding for physically (mechanically) removing layers formed on a surface of the semiconductor wafer, (b) wet chemical etching (wet etching) for removing impurities and damage on the surface of the semiconductor wafer, (c) polishing on the edge of the semiconductor wafer, and (d) polishing (buffing and so on) for flattening the front side and/or the back side of the semiconductor wafer (for example, see Japanese Patent Laid-Open No. 2001-358107).

DISCLOSURE OF THE INVENTION

Problems to be Solved by the Invention

When buffing is used as the final process for reclaiming the semiconductor wafer as disclosed in Japanese Patent Laid-Open No. 2001-358107, the surface of the semiconductor wafer can be flattened to some extent. However, it is difficult to reach a required level of flatness because of finer patterning of semiconductors in recent years.

Further, in buffing, abrasive grains and a chemical solution remain on the semiconductor wafer and thus a cleaning process is necessary. Moreover, waste liquid has to be treated after cleaning.

Moreover, abrasive grains may cause a large hole on a part of the surface of the semiconductor wafer, particles may be generated on the surface of the semiconductor wafer such that abrasive grains are embedded into a part of the surface of the semiconductor wafer, and other defects may partially appear.

The present invention has been devised in view of these problems. An object of the present invention is to provide a wafer reclamation method and a wafer reclamation apparatus which can minimize waste liquid and the like for reclaiming a semiconductor wafer and can reclaim the semiconductor wafer with a flat surface and high cleanliness.

Means for Solving the Problems

In order to solve the problems, a wafer reclamation method according to the present invention in which a semiconductor wafer is reclaimed by removing a different material layer and/or at least a part of a defective layer formed on a surface of the semiconductor wafer, the method including: a physically removing step of physically removing the different material layer and/or at least the part of the defective layer from the semiconductor wafer; a film forming step of forming a film on the surface of the semiconductor wafer from which the different material layer and/or at least the part of the defective layer have been removed in the physically removing step; and a dry etching step of plasma etching the surface of the semiconductor wafer together with the film formed in the film forming step.

Thus it is possible to save a chemical solution and the like, suppress the occurrence of waste liquid, and reclaim the semiconductor wafer to a semiconductor wafer with a flat and clean surface.

In the film forming step, the film may be formed by CVD (Chemical Vapor Deposition).

Thus the film can be formed using a plasma processing apparatus which performs plasma processing under a vacuum pressure as in a dry etching apparatus. Further, it is possible to form a film and perform dry etching without exposing at least the semiconductor wafer to atmospheric pressure.

Moreover, it is desirable to include, before the film forming step, a preliminary dry etching step of directly plasma etching the surface of the semiconductor wafer from which the different material layer and/or at least the part of the defective layer have been removed.

By removing the different material layer and/or at least the part of the defective layer, an altered layer and the like on the surface of the semiconductor wafer can be removed beforehand. Thus it is not necessary to change, for the altered layer, an etching condition set in the dry etching step such that a selection ratio between the film and the semiconductor wafer (Si) is 1. Further, since the edge on the uneven surface of the semiconductor wafer is smoothed by etching in the preliminary dry etching step, etching can be more evenly performed over the surface during dry etching after the film forming step of forming the film on the surface of the semiconductor wafer from which the different material layer and/or at least the part of the defective layer have been removed. It is therefore possible to further flatten the surface of the reclaimed semiconductor wafer.

Further, a wafer reclamation method in which a semiconductor wafer is reclaimed by removing a different material layer and/or at least a part of a defective layer formed on a surface of the semiconductor wafer, the method including: a chemically removing step of removing the different material layer and/or at least the part of the defective layer from the semiconductor wafer by wet etching; a film forming step of forming a film on at least one surface of the semiconductor wafer from which the different material layer and/or at least the part of the defective layer have been removed in the chemically removing step; and a dry etching step of plasma etching the surface of the semiconductor wafer together with the film formed in the film forming step.

Thus it is possible to eliminate the cleaning process of removing abrasive grains from the semiconductor wafer by polishing and the like during a wafer surface roughness finishing process and eliminate the need for a cleaning solution and the discarding of the cleaning solution, thereby reclaiming the semiconductor wafer to a semiconductor wafer with a flat and clean surface at lower cost.

Advantage Of The Invention

According to the present invention, it is not necessary to perform polishing (CMP, and so on) using a chemical solution, which contains abrasive grains, during a wafer surface roughness finishing process. Thus it is possible to eliminate the cleaning process of removing abrasive grains in the surface roughness finishing process. Further, it is possible to eliminate the need for a cleaning solution used in the process and the discarding of the solution. It is therefore possible to reclaim the semiconductor wafer to a wafer with a flat surface and high cleanliness at lower cost.

BRIEF DESCRIPTION OF THE DRAWINGS

FIG. 12A shows results of performing resist film formation+dry etching twice in smoothing of a Si wafer after grinding;

FIG. 12B shows the etching conditions of resist film formation+dry etching;

FIG. 13A is an explanatory drawing showing the dependence of the selection ratio of a resist coating on a wafer surface and Si of the wafer on the gas flow rate ratio of $SF_6/CF_4$ in the smoothing of the Si wafer after grinding;

FIG. 13B is an explanatory drawing showing the dependence of surface roughness on the gas flow rate ratio of $SF_6/CF_4$ in the smoothing of the Si wafer after grinding;

FIG. 13C shows other dry etching conditions when etching is performed at gas flow rate ratios of $SF_6/CF_4$ shown in FIGS. 13A and 13B;

FIG. 14A shows the conditions of dry etching alone and the conditions of resist film formation+dry etching in the smoothing of the Si wafer after grinding;

FIG. 14B shows the results of smoothing on the wafer surface under the conditions of FIG. 14A;

FIG. 16A is a schematic diagram showing the configuration of a wafer reclamation apparatus in a wafer roughness finishing process according to the embodiment of the present invention;

FIG. 16B is an explanatory drawing showing a double arm WA1 of a transport section for atmospheric pressure;

FIG. 20A is an explanatory drawing showing a surface condition of a wafer to be reclaimed, when the surface of the wafer is directly dry etched;

FIG. 20B is an explanatory drawing showing a surface condition of a wafer to be reclaimed, when the surface of the wafer is ground and then the ground surface is dry etched; and FIG. 21 is a process drawing showing the flow of a method of reclaiming a wafer according to CMP in which the wafer is polished using physicochemical removal in a wafer surface roughness process.

BEST MODE FOR CARRYING OUT THE INVENTION

The following will describe embodiments of the present invention with reference to the accompanying drawings.

(First Embodiment)

A wafer reclamation method according to a first embodiment of the present invention will be described below with reference to the accompanying drawings.

Figure 1:
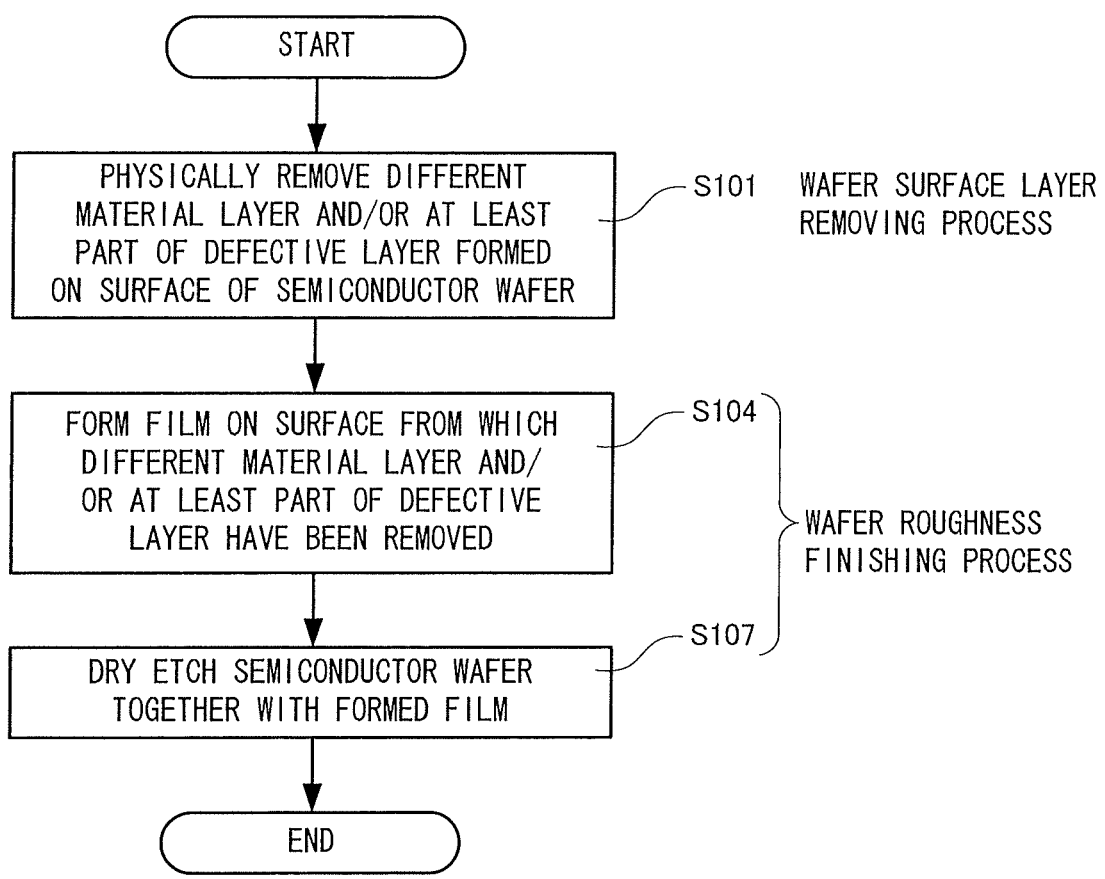
FIG. 1 is a flowchart showing the flow of a wafer reclamation method according to a first embodiment of the present invention.
Figure 2:
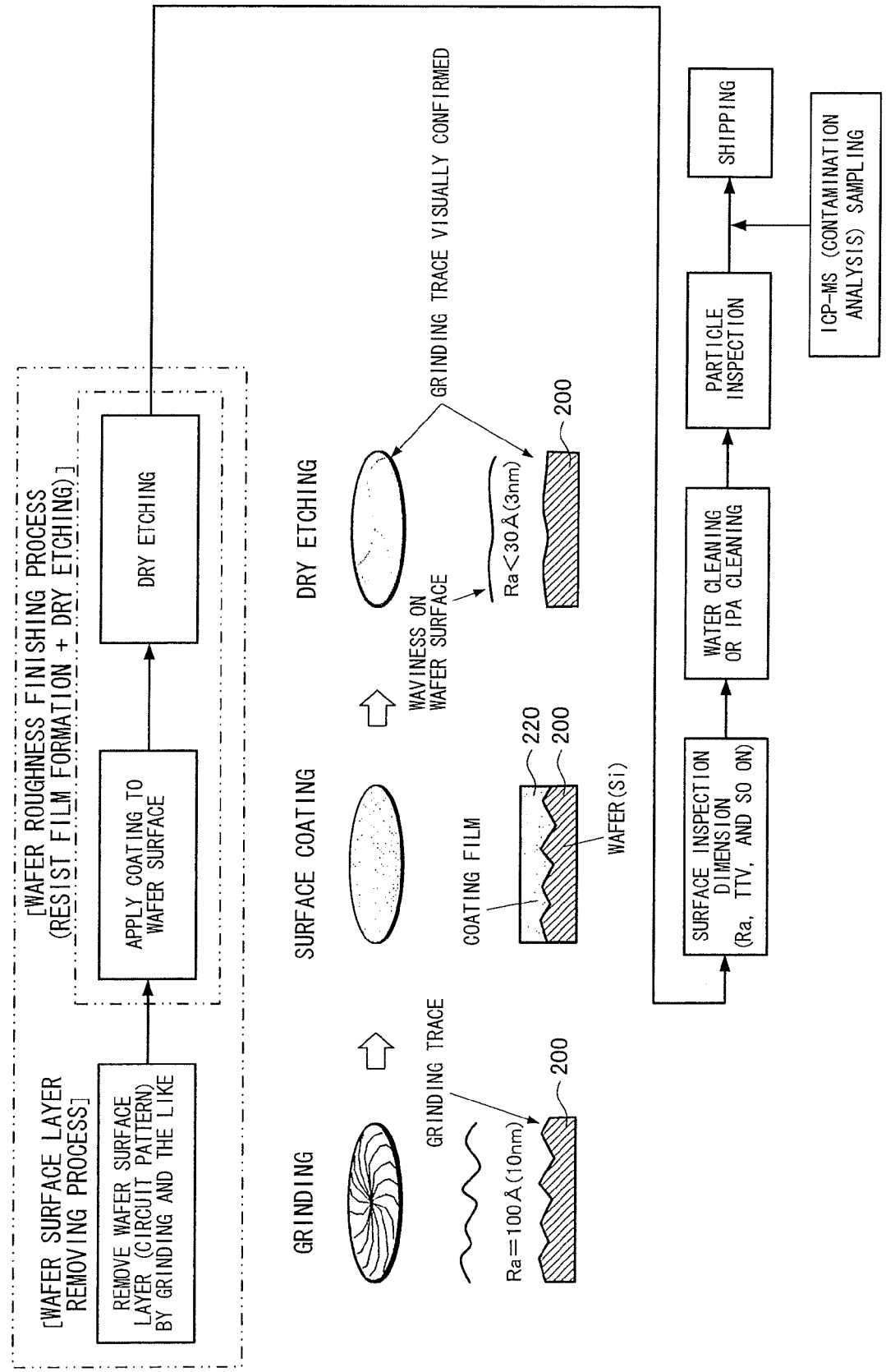
FIG. 2 is a process drawing showing the flow of the wafer reclamation method according to the first embodiment.

FIG. 1 is a flowchart showing the flow of the wafer reclamation method according to the first embodiment. FIG. 2 is a process drawing showing the flow of the wafer reclamation method according to the first embodiment.

As shown in FIGS. 1 and 2, first, a physically removing step/wafer surface layer removing process (S101) is performed in a wafer surface layer removing process to physically remove a different material layer 210 and/or at least a part of a defective layer formed on a surface of a semiconductor wafer 200.

In this method, the semiconductor wafer 200 serves as a base for forming a semiconductor device and is obtained by machining a semiconductor material such as Si and GaAs into a thin disk (hereinafter also called a "wafer").

The different material layer 210 means various kinds of layers formed on the semiconductor wafer 200 to manufacture a semiconductor device. For example, the different material layer 210 includes $SiO_2$ as an insulating film, a metal film for carrying electrons, and a semiconductor layer (semiconductor circuit layer) for performing some kinds of function. Further, the different material layer 210 is formed in various states on the semiconductor wafer 200 according to the progress of the manufacturing process of semiconductors.

Physical removal means removal other than a chemical method. For example, physical removal includes removing the different material layer 210 from the semiconductor wafer 200 by performing grinding using a grinding wheel and the like on a surface of a wafer being processed, cutting for removing the different material layer 210 with a cutting tool, shot blasting for removing the different material layer 210 by colliding fine particles such as sand against the different material layer 210 by a jet of air, and buffing for rubbing off the different material layer 210 with abrasive grains by using a cloth and the like. In physical removal such as buffing, materials such as acid and alkaline paste are also simultaneously used the use of these materials is also included in physical removal. In other words, the different material layer 210 is weakened by a chemical method but is further removed by a physical force, so that the use of these materials is included in physical removal.

Figure 3:
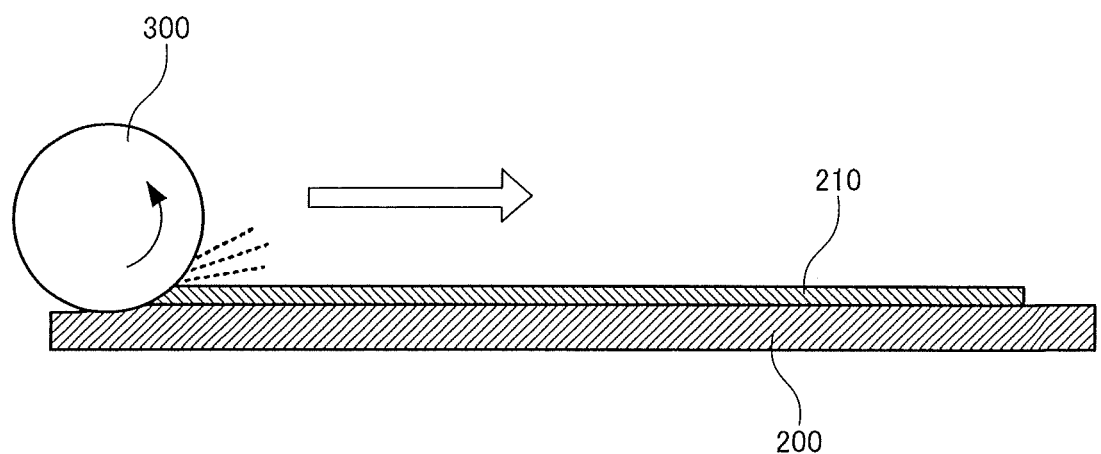
FIG. 3 is a conceptual diagram showing an example of physical removal.

FIG. 3 is a conceptual diagram showing an example of physical removal.

As shown in FIG. 3, the different material layer 210 is formed on the semiconductor wafer 200. The different material layer 210 is physically removed by a cylindrical grinding wheel 300 rotating in contact with the different material layer 210. Further, the grinding wheel 300 is moved along the surface of the semiconductor wafer 200, so that the different material layer 210 can be completely removed. In order to completely remove the different material layer 210, the surface of the semiconductor wafer 200 is slightly ground together with the different material layer 210.

Figure 4A:
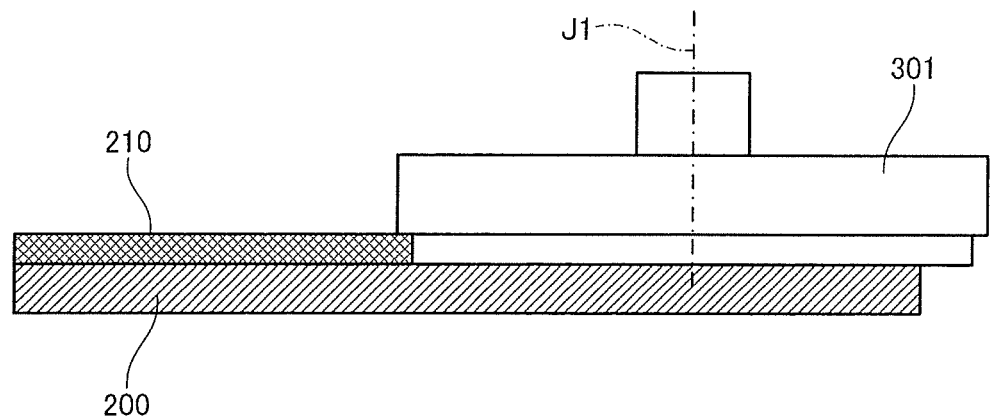
FIG. 4A is a sectional view showing the concept of another example of physical removal.
Figure 4B:
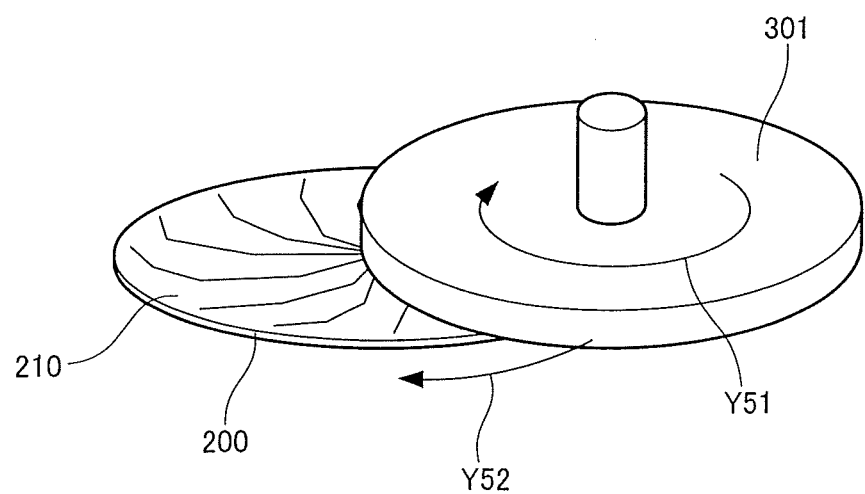
FIG. 4B is a perspective view showing the concept of the another example of physical removal.

FIGS. 4A and 4B show another example of physical removal.

As in FIG. 3, the different material layer 210 is formed on the semiconductor wafer 200. Further, as shown in FIG. 4A, a disk-shaped grinding wheel 301 is in contact with the different material layer 210 while rotating in a direction of an arrow Y51 about an axis J1 serving as a rotation axis as shown in FIG. 4B, so that the different material layer 210 is physically removed. Moreover, as shown in FIG. 4B, the overall grinding wheel 301 is moved along the surface of the semiconductor wafer 200 in the circumferential direction of the semiconductor wafer 200 as indicated by an arrow Y52, so that the different material layer 210 can be completely removed. Also in this case, the surface of the semiconductor wafer 200 is slightly ground together with the different material layer 210 to completely remove the different material layer 210.

Further, in order to cool the semiconductor wafer 200 and prevent scattering of shavings, water and the like may be applied to parts brought into contact with the grinding wheels 300 and 301.

In this case, in the final wafer roughness finishing for a reclaimed wafer, flatness of 30 Å or less is demanded. When surface roughness Ra on the surface of the semiconductor wafer 200 is larger than 30 Å, the semiconductor wafer 200 has a rough surface. Generally, the surface roughness Ra is increased to at least 100 Å by grinding with a grinding wheel.

For comparison, FIG. 20A shows the case where the semiconductor wafer 200 is reclaimed such that the wafer to be reclaimed is directly dry etched without removing the different material layer 210 formed on the surface of the semiconductor wafer 200.

In this method, however, a selection ratio $\alpha$ of a circuit layer serving as the different material layer 210 and the semiconductor wafer 200 (Si) is not 1, resulting in uneven etching.

FIG. 20B shows the case where the semiconductor wafer 200 is reclaimed such that the wafer to be reclaimed is directly dry etched after grinding for removing the different material layer 210 formed on the surface of the semiconductor wafer 200.

In this method, however, grinding traces appear on the surface of the ground wafer and thus large waviness (Ra=100 Å) is left on the surface of the wafer even after dry etching.

As previously mentioned, by simply performing dry etching, small unevenness can be eliminated but a large step is transferred as it is or as an extended step, so that the surface roughness Ra on the surface of the semiconductor wafer 200 cannot be improved. Therefore, waviness on the surface of the semiconductor wafer 200 cannot be so improved after grinding and desired flatness cannot be obtained on the wafer.

After the physically removing step (S101) of the wafer surface layer removing process, a film forming step (S104) is performed in a wafer roughness finishing process to form a film 220 of resist and the like on the rough surface of the semiconductor wafer 200 after the different material layer 210 is completely removed in the physically removing step (S101).

The film 220 of resist and the like (hereinafter also called a coating film 220) is formed on the surface of the semiconductor wafer 200 by, for example, a spin coating method. In this method, resist is applied to the surface of the semiconductor wafer 200 as an example of the film 220 formed on the surface of the semiconductor wafer 200; meanwhile, the semiconductor wafer 200 is rotated by a simple device about a rotation axis that is an axis perpendicular to the plane of the semiconductor wafer 200. This method is preferable because the resist can cover the overall rough surface of the semiconductor wafer 200 and the surface of the coating film 220 can be flat after the resist is applied.

Figure 5A:
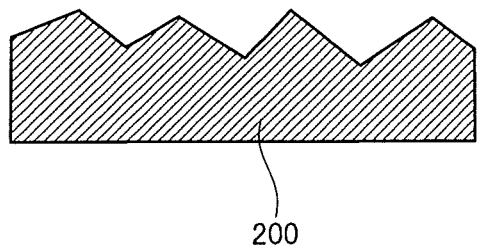
FIG. 5A is a sectional view schematically showing a surface condition of a semiconductor wafer on which a different material layer and/or at least a part of a defective layer has been removed.
Figure 5B:
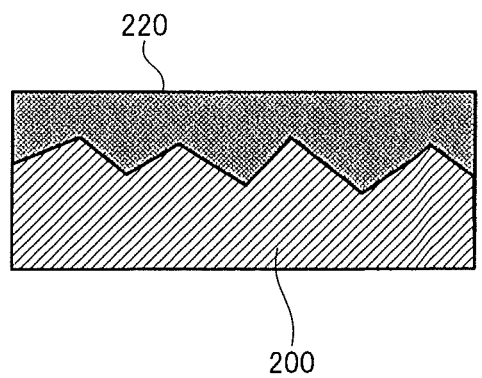
FIG. 5B is a sectional view schematically showing a surface condition of the semiconductor wafer on which a film has been formed.

FIGS. 5A and 5B are sectional views schematically showing a surface condition of the semiconductor wafer.

As shown in FIG. 5A, the semiconductor wafer 200 from which the different material layer 210 and/or at least a part of a defective layer has been removed has a rough surface (for example, the surface roughness Ra is 100 Å).

As shown in FIG. 5B, the film 220 formed on the semiconductor wafer 200 is preferably so thick as to cover the maximum peak of the rough surface of the semiconductor wafer 200. The surface of the formed film 220 is formed in parallel with the back side of the semiconductor wafer 200 because the reclaimed semiconductor wafer 200 can have an even thickness. Preferably, the surface of the formed film 220 is more flat than at least the rough surface of the semiconductor wafer 200. This is because the flatness of the surface of the film 220 affects the surface roughness Ra on the surface of the semiconductor wafer 200 obtained at the final stage.

In the foregoing explanation, a different material is completely removed by the physically removing step and then the film forming step of forming the film 220 on the rough surface of the semiconductor wafer 200 is performed. When the different material 210 is not applied to the surface of the semiconductor wafer 200 or when the different material 210 is not applied to the surface of the semiconductor wafer 200 from the start, the film forming step of forming the film on the rough surface of the semiconductor wafer 200 may be performed without performing the physically removing step (S101).

Next, a dry etching step (S107) is performed to mirror-finish by gas plasma the surface of the semiconductor wafer 200 of the side of the formed film 220 together with the film 220 formed in the film forming step (S104) of the wafer roughness finishing process.

In this case, gas plasma is a state in which positive ions and electrons of highly ionized gas are mixed. Gas plasma can be obtained by introducing desired gas into a vacuum pressure chamber and applying a high-frequency voltage and so on.

The gas is not particularly limited but preferably, gas enabling etching on the semiconductor wafer 200 at a high rate includes gas containing F (fluorine) such as $SF_6$, $CF_4$, $NF_3$, $CHF_3$, $C_2F_6$, $C_3F_8$, $C_5F_8$, $C_4F_8$, $SiF_4$, and $F_2$ and gas containing other halogens such as $Cl_2$, HCl, HI, HBr, $BCl_3$, and $SiCl_4$. Further, the gas is not always used alone and multiple kinds of gas may be mixed and used. Moreover, gas not directly contributing to etching, for example, stabilization of plasma may be used as added gas. For example, gas of $O_2$, Ar, He, and so on may be used.

It is desirable to select gas or a combination of gas with a selection ratio of about 1 between the film 220 and the semiconductor wafer 200.

To be specific, when $SF_6$ and $CF_4$ are selected as etching gas, a gas ratio for obtaining a selection ratio of 1 is $SF_6/CF_4$ 40/60 to 100/0 at a vacuum pressure of 0.7 Pa. The surface roughness Ra on the surface of the semiconductor wafer 200 is particularly reduced at a gas ratio of $SF_6/CF_4$ 80/20 to 100/0.

Figure 6:
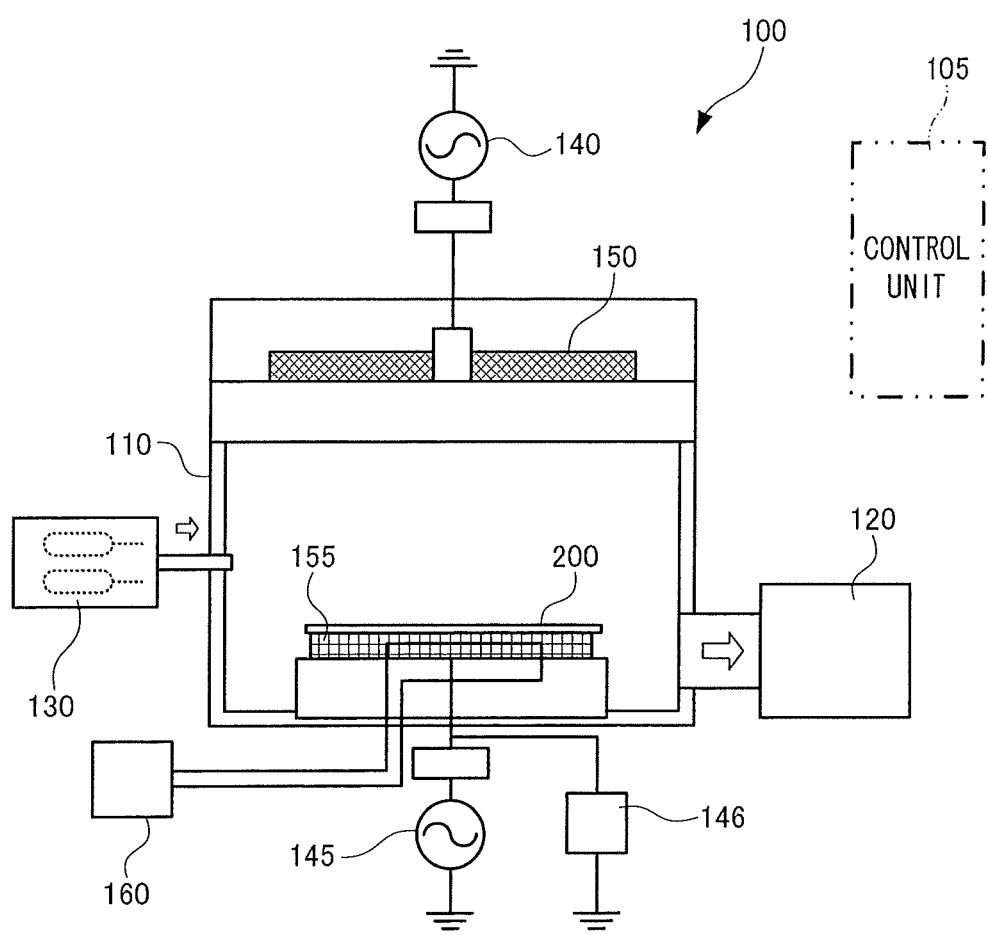
FIG. 6 is a view schematically showing a configuration example of a dry etching apparatus.

FIG. 6 is a view schematically showing a dry etching apparatus.

As shown in FIG. 6, a dry etching apparatus 100 includes a vacuum pressure chamber 110 capable of reducing a pressure, a vacuum pressure exhaust system 120, a gas supply system 130, power supplies 140 and 145, an electrode 150, a lower electrode 155, a temperature controller 160, and a control unit 105 for collectively controlling these devices.

The vacuum pressure chamber 110 is internally kept at a vacuum pressure and has strength against atmospheric pressure.

The vacuum pressure exhaust system 120 is a group of devices for exhausting air and the like in the vacuum pressure chamber 110 to the outside of the vacuum pressure chamber 110 by using a turbo pump and the like (not shown).

The gas supply system 130 is a group of devices which can introduce multiple gases supplied from a gas cylinder and a liquid gas container, into the vacuum pressure chamber 110 in a predetermined ratio.

The power supplies 140 and 145 are power supplies for supplying power necessary for generating plasma in the vacuum pressure chamber 110. The high-frequency power supplies 140 and 145 are respectively connected to the electrodes 150 and 155 vertically arranged in the vacuum pressure chamber 110.

The electrode 150 acts as an antenna which emits high-frequency power, which is supplied from the high-frequency power supply 140, into the vacuum pressure chamber 110 and oscillates gas to generate plasma. The electrode 150 disposed in the upper part of the vacuum pressure chamber 110 is shaped like a coil. The lower electrode 155 is shaped like a table on which the semiconductor wafer 200 can be placed. Bias power is supplied to the lower electrode 155 by high-frequency power supplied from the high-frequency power supply 145, and the etching rate is improved by drawing the plasma ions of reactant gas in the vacuum pressure chamber 110 to the side of the semiconductor wafer 200 placed on the side of the lower electrode 155.

The temperature controller 160 is a device for increasing the temperature of the semiconductor wafer 200 to improve the etching rate and cooling the semiconductor wafer 200, which is heated by plasma energy, to a predetermined constant temperature to stabilize the etching rate. Generally, in order to cool the lower electrode 155 on which the semiconductor wafer 200 is placed, a cooling medium (pure water, oil) and the like are circulated in the lower electrode 155 or a cooling medium (He) is circulated at a constant temperature between the lower electrode 155 and the back side of the semiconductor wafer 200.

Further, in order to secure the semiconductor wafer 200 on the lower electrode 155 in a vacuum pressure, the lower electrode 155 includes an electrostatic chuck (ESC) and the like (not shown) for electrostatically attracting the semiconductor wafer 200. A direct-current power supply 146 is connected to the electrostatic chuck. With this configuration, the semiconductor wafer 200 and the lower electrode 155 uniformly come into contact with each other, and the temperature of the semiconductor wafer 200 can be evenly adjusted by the temperature controller 160.

Dry etching is performed using the foregoing dry etching apparatus 100 and gas. To be specific, (1) the semiconductor wafer 200 on which the film is formed is placed on the lower electrode 155 in the vacuum pressure chamber 110, and the semiconductor wafer 200 is secured by electrostatic attraction. (2) The inside of the vacuum pressure chamber 110 is evacuated to a predetermined vacuum pressure by the vacuum pressure exhaust system 120. (3) Predetermined gas is introduced into the vacuum pressure chamber 110. (4) High-frequency voltage is applied to the electrode 150 by using the power supply 140 to generate plasma of gas having been introduced into the vacuum pressure chamber 110. (5) High-frequency voltage is applied to the lower electrode 155 by using the power supply 145 and plasma ions of reactant gas in the vacuum pressure chamber 110 are drawn to the side of the semiconductor wafer 200 placed on the side of the lower electrode 155. (6) Plasma is caused to act on the semiconductor wafer 200 for a certain period of time, so that the surface of the semiconductor wafer 200 of the side of the formed film is dry etched by plasma so as to be mirror-finished together with the film formed in the film forming step.

Thus roughness caused by physical removal on the surface of the semiconductor wafer 200 and an altered layer 205 are removed, achieving a flat surface.

The foregoing method can reclaim the semiconductor wafer 200 with a flat surface having no particles or altered points thereon.

Further, by providing a load lock chamber for switching atmospheric pressure and a vacuum pressure, the semiconductor wafer 200 can be loaded and unloaded without opening the vacuum pressure chamber 110 to atmospheric pressure.

For comparison, the following will describe a method of reclaiming a wafer by CMP (chemical mechanical polishing) which is a wafer roughness finishing method of polishing the wafer surface of the semiconductor wafer 200 with high precision by physicochemical removal using a chemical solution containing abrasive grains in the wafer surface roughness finishing process.

For example, as shown in FIG. 21, this wafer reclamation method includes a wafer surface layer removing process of removing, by grinding and the like, the different material layer 210 and/or at least a part of the defective layer formed on the surface of the semiconductor wafer 200 and a wafer finishing process using polishing (CMP) and lapping, so that a wafer is reclaimed such that at least one surface of the wafer is processed again to a mirror-finished surface.

On the front side of the semiconductor wafer 200 to be mirror-finished and the back side of the wafer on the opposite side from the front side, when a state on the back side of the wafer is satisfactory, the front side of the wafer is polished (CMP). When the state is not satisfactory because of small protrusions acting as a source of particles on the back side, the back side is lapped.

Through a main process including the wafer surface layer removing process and the wafer finishing process, the surface of the semiconductor wafer 200 is reclaimed to about the surface roughness Ra<10 Å (1 nm).

However, in this method, polishing is performed by physicochemical removal using a chemical solution containing abrasive grains in the wafer surface roughness finishing process. Because of polishing by physiochemical removal, the semiconductor wafer 200 has to be cleaned to remove the abrasive grains caused by wet etching and the like. Thus it is necessary to apply a large amount of chemical solution and discard the chemical solution after the wafer surface roughness finishing process.

In contrast to the foregoing method, according to the present invention, it is not necessary to perform polishing (including CMP and polishing) using a chemical solution containing abrasive grains generated by polishing and the like in the wafer surface roughness finishing process. Thus in the wafer surface roughness finishing process, it is possible to eliminate the cleaning process for removing abrasive grains in the surface roughness finishing process of the semiconductor wafer 200 and eliminate the need for a cleaning solution used in the cleaning process and the discarding of the cleaning solution. Consequently, it is possible to reduce the cost and reclaim the wafer with a flat surface and high cleanliness.

In the comparative example, when the state of the back side of the wafer is not satisfactory because of small protrusions acting as a source of particles on the back side, the back side is lapped. In the wafer roughness finishing process of dry etching by plasma the surface of the semiconductor wafer 200 of the side of the formed film 220 together with the film 220 formed in the film forming step according to the embodiment of the present invention, it is desirable that the front side and back side of the semiconductor wafer 200 are inverted to apply the film 220 to the back side of the wafer and the surface (back side) of the semiconductor wafer 200 is processed by dry etching on the side of the formed film 220 together with the formed film 220. Further, when the state of the back side of the semiconductor wafer 200 is not satisfactory, the back side of the wafer may be lapped as in the comparative example as long as the reclamation of the wafer is not adversely affected.

(Second Embodiment)

The following will describe a wafer reclamation method according to a second embodiment of the present invention with reference to the accompanying drawings.

Figure 7:
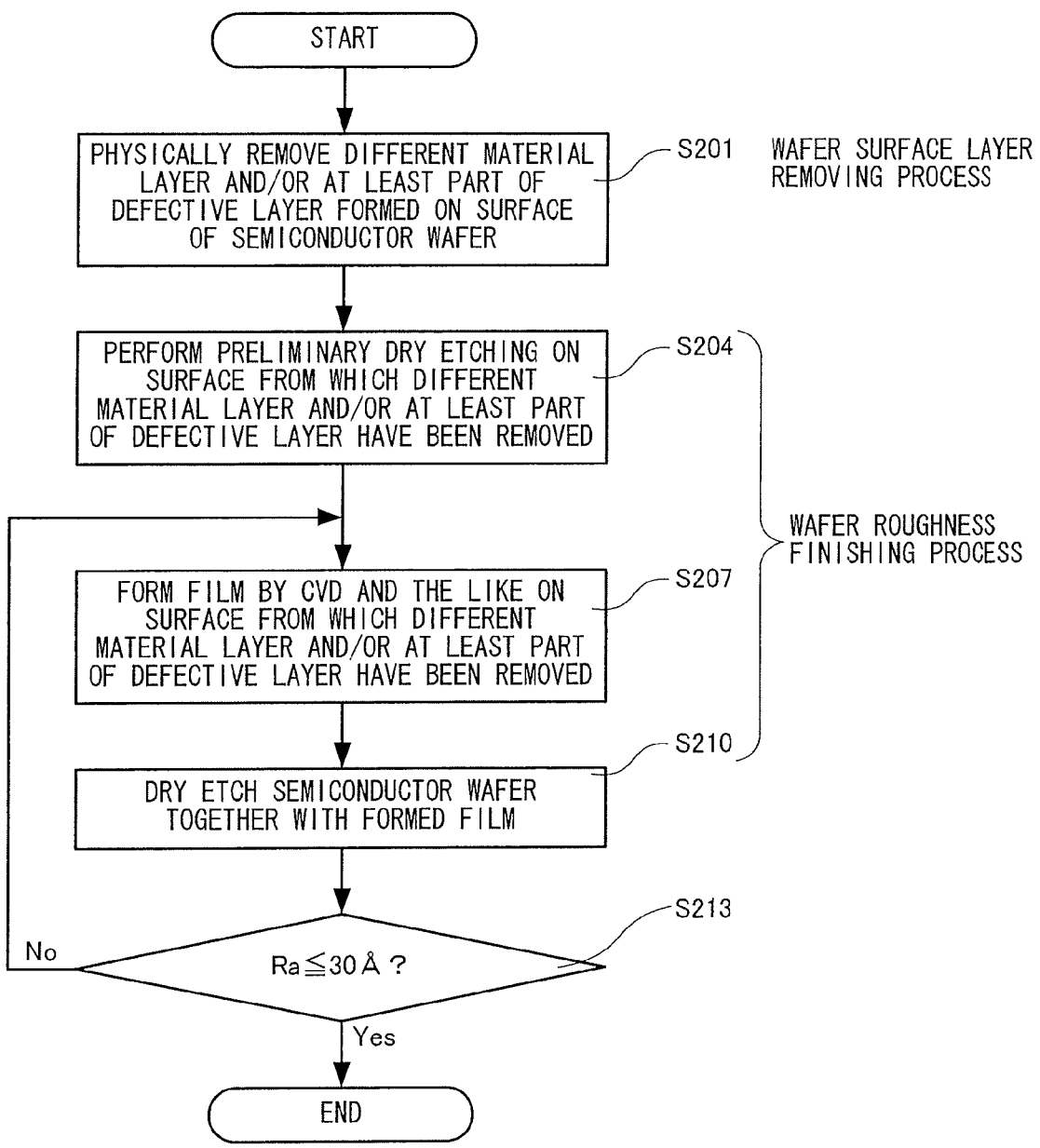
FIG. 7 is a flowchart showing the flow of a wafer reclamation method according to a second embodiment of the present invention.
Figure 8:
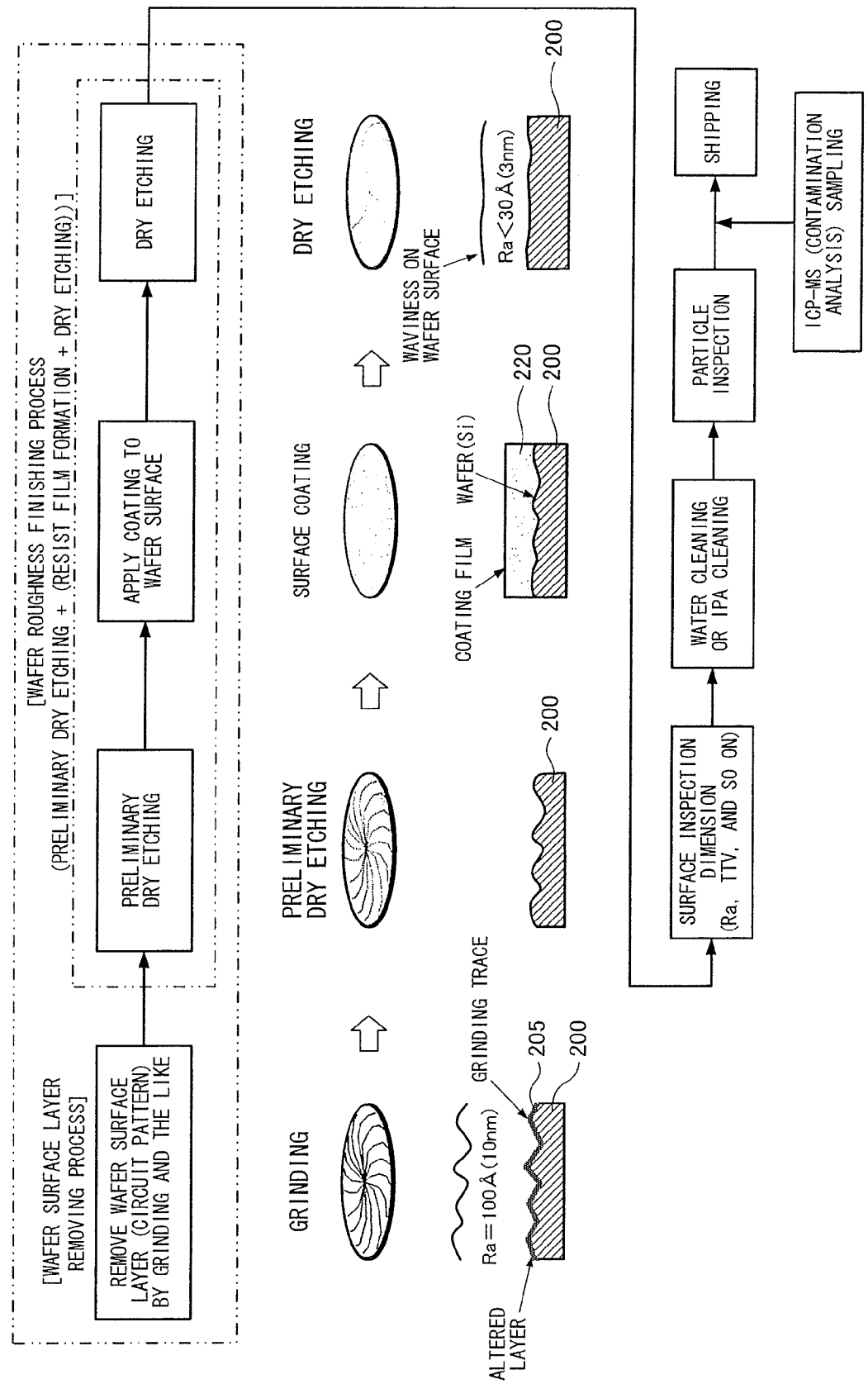
FIG. 8 is a process drawing showing the flow of the wafer reclamation method according to the second embodiment.

FIG. 7 is a flowchart showing the flow of the wafer reclamation method according to the second embodiment. FIG. 8 is a process drawing showing the flow of the wafer reclamation method according to the second embodiment. Devices used in the wafer reclamation method of the second embodiment are the same as in the first embodiment and thus the explanation thereof is omitted.

As shown in FIGS. 7 and 8, first, in a wafer surface layer removing process, a different material layer 210 and/or at least a part of a defective layer formed on a surface of a semiconductor wafer 200 are physically removed (S201).

Next, the semiconductor wafer 200 from which the different material layer 210 and/or at least the part of the defective layer have been removed is placed in a dry etching apparatus 100 in a wafer surface roughness finishing process, and preliminary dry etching is performed on the semiconductor wafer 200 (S204).

Figure 9:
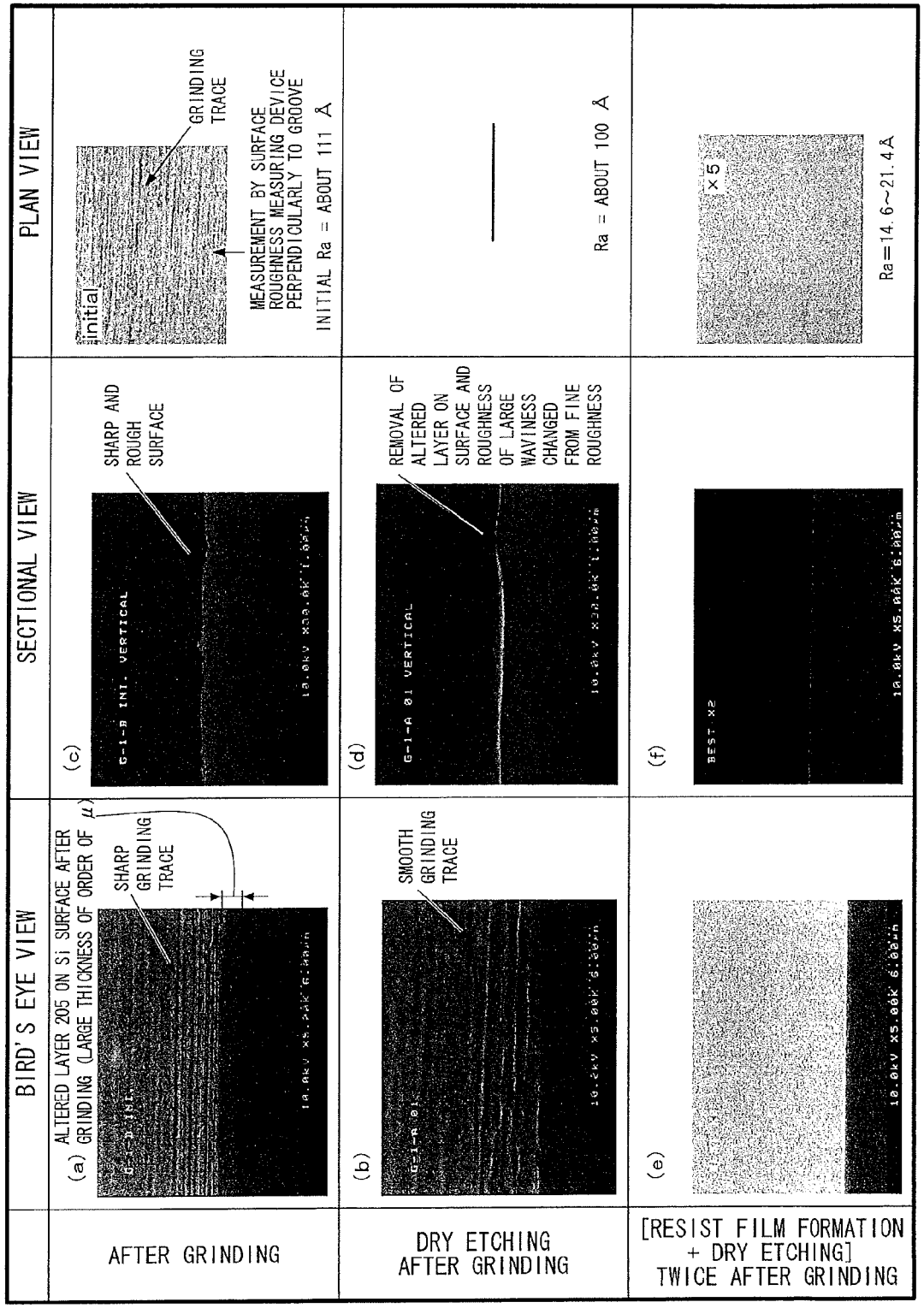
FIG. 9 is a view including electron micrographs showing the surface conditions of the semiconductor wafer after grinding and after processing in the wafer reclamation methods of the first and second embodiments.

Thus, an altered layer 205, which is generated on a surface of the semiconductor wafer 200 as shown in (a) of FIG. 9 according to a machining rate and so on of physical removal, can be removed beforehand as shown in (b) of FIG. 9. Further, sharp grinding traces generated on the surface of the semiconductor wafer 200 by physical removal as shown in (a) of FIG. 9 are smoothed as shown in FIG. 9(b). As shown in (c) and (d) of FIG. 9, sharp roughness caused by grinding on the surface ((c) of FIG. 9) changes to large wavy roughness ((d) of FIG. 9). However, surface roughness Ra on the surface of the semiconductor wafer 200 is not remarkably improved.

As previously mentioned, the altered layer 205 on the surface of the semiconductor wafer 200 is removed beforehand. Thus when the surface of the semiconductor wafer 200 of the side of a formed film 220 is dry etched together with the film 220, it is possible to prevent the altered layer 205 from being selectively etched instead of the film 220 or conversely prevent the altered layer 205 from being hardly etched. In other words, it is possible to prevent etching conditions from being disturbed by the altered layer 205 acting as an uncertain factor occurring on the surface of the semiconductor wafer 200 according to the machining rate and so on of physical removal in the wafer surface layer removing process. The etching conditions include a gas ratio adjusted to have a selection ratio of 1 between the semiconductor wafer 200 on which the altered layer 205 is not formed and the film 220. Thus it is possible to more stably improve the surface roughness Ra on the surface of the semiconductor wafer 200 after reclamation.

Next, the film 220 is formed on the surface of the semiconductor wafer 200 (S207). In the present embodiment, the film 220 is formed without transporting the semiconductor wafer 200 out of the dry etching apparatus 100. To be specific, gas containing one of $C_4F_8$, $CHF_3$, and hydrocarbon (including $CH_4$ and $C_2H_6$) or mixed gas thereof is introduced into a vacuum pressure chamber 110 and high-frequency voltage is applied to an electrode 150, so that the film 220 is formed on the semiconductor wafer 200. Moreover, energy to be introduced is lower than in etching.

By forming the film thus according to a plasma CVD method, it is possible to perform the film formation and etching in the same vacuum pressure chamber 110, thereby omitting time for evacuation to a vacuum pressure and time for transporting the semiconductor wafer 200.

Further, a CVD chamber may be provided near the vacuum pressure chamber 110 to allow the semiconductor wafer 200 to be alternately placed in the two chambers without being returned to atmospheric pressure.

Next, the semiconductor wafer 200 is dry etched with the film 220 (S210).

After that, it is determined whether the surface roughness Ra on the surface of the semiconductor wafer 200 is not larger than 30 Å (S213). The determining method is not particularly limited. For example, the surface roughness Ra on the surface of the semiconductor wafer 200 may be actually measured or may be empirically determined in consideration of the kind of introduced gas, introduced power, an etching time period, and so on. When the surface roughness Ra is not larger than 30 Å (S213: Yes), the process exits. When the surface roughness Ra is larger than 30 Å (S213: No), the process returns to the film forming step (S207).

The foregoing method can reliably reduce the surface roughness Ra of the semiconductor wafer 200 to 30 Å or less.

Although the film is formed by CVD in the foregoing explanation, the surface roughness Ra on the surface of the wafer can be reduced to 30 Å or less also by other methods such as a spin coating method. The criterion of the surface roughness Ra on the surface of the wafer varies among the purposes of the reclaimed semiconductor wafer 200. The criterion may be 20 Å or less or 10 Å or less.

EXAMPLE

A specific example of the present invention will be described below.

First, in the wafer surface layer removing process, a surface of the silicon wafer of the semiconductor wafer 200 having the different material layer 210 provided thereon was ground by a grinding wheel and the like, and the different material layer 210 was removed from the surface of the silicon wafer. The surface roughness Ra on the surface of the silicon wafer was at least 100 Å after grinding.

Next, in the wafer roughness finishing process, the silicon wafer was set on a spin coater for applying resist to the wafer surface of the semiconductor wafer 200 and the spin coater was rotated at 2000 rpm to form a resist film on the surface of the silicon wafer of the semiconductor wafer 200. The resist film was about 18000 Å in thickness.

Next, the semiconductor wafer 200 was baked at 120° C. for two minutes to solidify the resist film applied on the wafer surface of the semiconductor wafer 200.

After that, the silicon wafer of the semiconductor wafer 200 having the resist film formed thereon was set in the dry etching apparatus, and the wafer surface of the semiconductor wafer 200 of the side of the formed film 220 was dry etched together with the formed film 220.

FIG. 12B shows the dry etching conditions.

With the foregoing dry etching process, as shown in FIG. 12A, the silicon wafer was obtained such that the surface roughness Ra was 26.9 Å on the wafer surface of the semiconductor wafer 200.

Further, the resist film 220 was similarly formed again on the surface of the silicon wafer of the semiconductor wafer 200 with the surface roughness Ra 26.9 Å, and second dry etching was performed under the conditions of FIG. 12B.

(e) and (f) of FIG. 9 are views including electron micrographs showing the surface conditions of the semiconductor wafer 200 after the completion of the second dry etching. (e) of FIG. 9 is a bird's eye view and (f) of FIG. 9 is a sectional view.

As shown in (e) and (f) of FIG. 9, the surface of the silicon wafer of the semiconductor wafer 200 was observed with a scanning electron microscope and it was confirmed that the surface was flat. Further, any particles or altered portions were not confirmed.

The surface roughness Ra was 14.6 Å to 21.4 Å on the surface of the silicon wafer obtained by dry etching.

As previously mentioned, by using the wafer reclamation method according to the present invention, it is possible to obtain the wafer surface roughness Ra of 30 Å or less on the semiconductor wafer 200 on which the different material layer 210 has been formed. If necessary, it is possible to reclaim the semiconductor wafer 200 with surface roughness of 20 Å or less.

After the completion of dry etching of the wafer roughness finishing process, the semiconductor wafer 200 can be used as it is. Thus it is not necessary to perform cleaning for removing the exfoliated grinding wheel components and abrasive grains and the like, and a large amount of waste liquid generated by cleaning for removing abrasive grains can be eliminated.

As previously mentioned, the foregoing effects can be obtained in the wafer reclamation methods of the first and second embodiments. In the final wafer roughness finishing of the reclaimed wafer, required flatness is 30 Å or less, which is sufficiently achieved in the first and second embodiments. However, the following problems are left unsolved:

Specifically, in the wafer surface layer removing process, the different material layer 210 and/or at least a part of a defective layer formed on the surface of the semiconductor wafer 200 are removed by grinding, and then in the wafer roughness finishing process, the film forming step is performed to form the film 220 on the surface of the semiconductor wafer 200 from which the different material layer 210 and/or at least the part of the defective layer have been removed. When etching is performed by plasma on the surface of the semiconductor wafer 200 of the side of the formed film 220 together with the film 220 formed in the film forming step, the surface roughness Ra (<22 Å (2.2 nm)) on the wafer surface of the semiconductor wafer 200 can be improved by repeating resist film formation+dry etching. However, after resist film formation+dry etching is repeated four times, the surface roughness Ra can be improved on the wafer surface of the semiconductor wafer 200 but small traces of grinding grooves are visually confirmed (when diagonally viewing the wafer surface of the semiconductor wafer 200) on the wafer surface of the semiconductor wafer 200 after wafer roughness finishing.

Further, in the wafer surface layer removing process, when the wafer surface of the semiconductor wafer 200 is ground, asperities of cut grooves are found on the wafer surface of the semiconductor wafer 200 after grinding. Thus foreign matters acting as a source of particles are likely to adhere to the asperities on the wafer surface and remain thereon.

Therefore, when resist film formation+dry etching is performed in the subsequent wafer roughness finishing process, the surface roughness Ra on the wafer surface of the semiconductor wafer 200 is improved by setting a selection ratio of 1 between the resist applied to the wafer surface of the semiconductor wafer 200 and Si of the semiconductor wafer 200. However, the selection ratio may not be 1 depending upon the materials of the foreign matters having adhered to the wafer surface of the semiconductor wafer 200 and remained thereon. Further, the foreign matters left without being dry etched may cause roughness and particles locally on the wafer surface of the semiconductor wafer 200.

To address the foregoing problems, in a third embodiment described below, the following conditions are set as main target specifications:

Value of Surface Roughness Ra (Arithmetic Average Roughness Ra)

10 Å (1 nm) or less (the measured length is 50 μm)

TTV (Total Thickness Variation: the Maximum Value of the Overall Thickness Measured by Chucking the Wafer, that is, the Waviness of the Overall Wafer)

±5 (the absolute value is 10) μm or less (Even when the thickness decreases, a TTV tolerance is kept constant)

Thickness (the Thickness of the Wafer, that is, a Thickness Used as a Dummy Wafer after Reclamation)

at least 600 μm (the initial value is 700 μm)

Dry Etching Amount

2 μm or less on the wafer after the different material layer (circuit layer) and/or at least the part of the defective layer are removed on a surface of the wafer on the side where the surface condition of the wafer is smoothed (the target value varies according to the kind of the reclaimed wafer and processing in the wafer surface layer removing process).
Pollution (or Contamination) Containing:
Al $1\times10E13$ atom/cm$^2$ or less
Na $2\times10E10$ atoms/cm$^2$ or less
Cr $2\times10E10$ atoms/cm$^2$ or less
Surface Condition
  Mirror surface
(Third Embodiment)

A wafer reclamation method according to a third embodiment of the present invention will be described below in accordance with the accompanying drawings.

The wafer reclamation method according to the third embodiment, wherein a semiconductor wafer is reclaimed by removing a different material layer 210 (circuit layer) and/or at least a part of a defective layer formed on a surface of a semiconductor wafer 200, from the semiconductor wafer 200 by chemical removal using wet etching; forming a film 220 at least on one surface of the semiconductor wafer 200 from which the different material layer 210 and/or at least the part of the defective layer have been removed by wet etching; and dry etching by plasma the surface of the semiconductor wafer 200 of the side of the formed film 220, together with the film 220 formed by the film formation.

Figure 10:
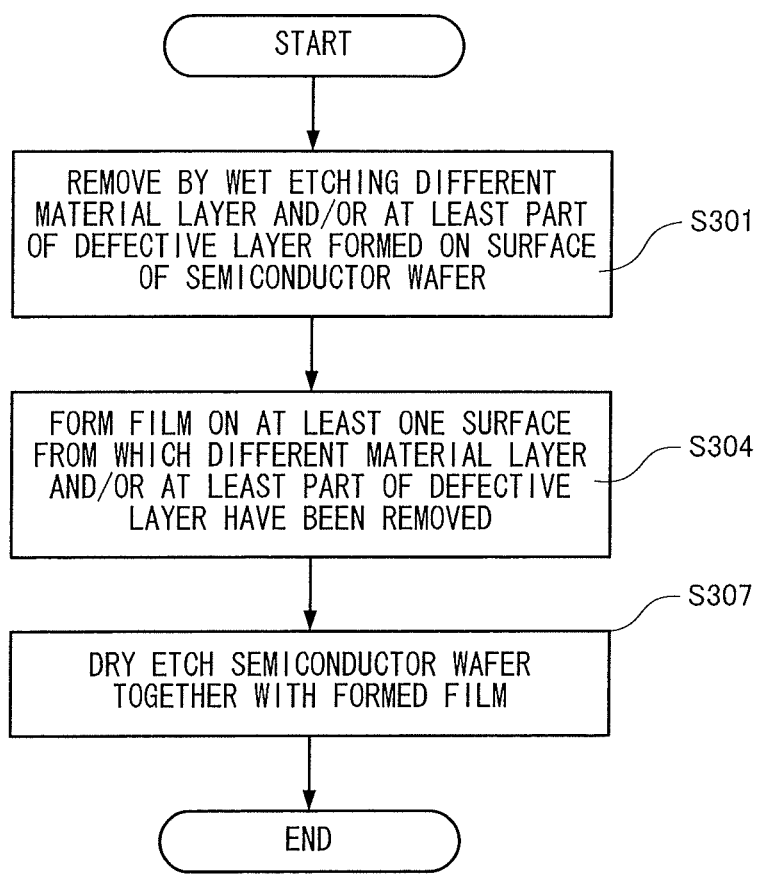
FIG. 10 is a flowchart showing the flow of a wafer reclamation method according to a third embodiment of the present invention.
Figure 11:
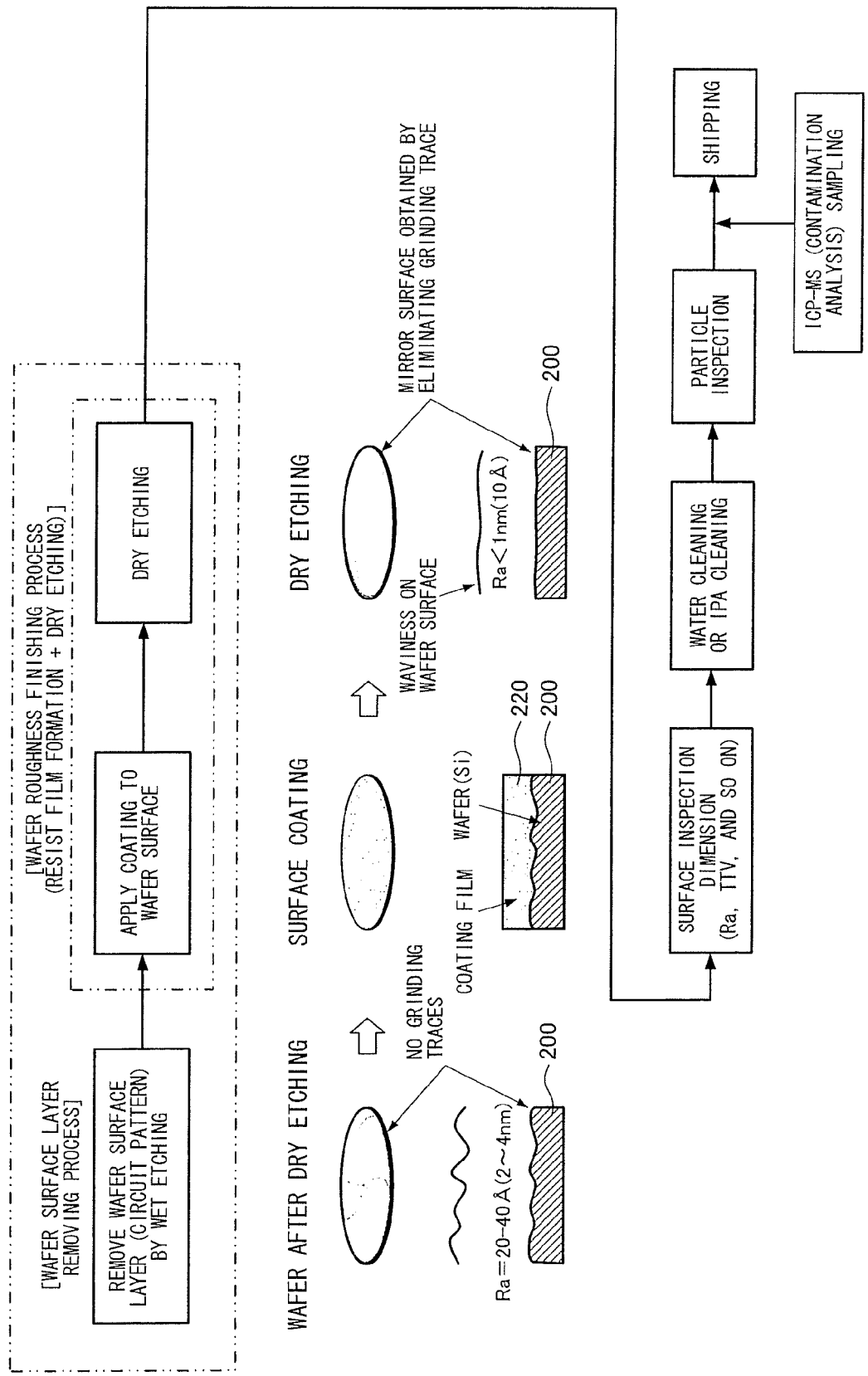
FIG. 11 is a process drawing showing the flow of the wafer reclamation method according to the third embodiment.

FIG. 10 is a flowchart showing the flow of the wafer reclamation method according to the third embodiment. FIG. 11 is a process drawing showing the flow of the wafer reclamation method according to the third embodiment.

As shown in FIGS. 10 and 11, first, the different material layer 210 such as a circuit pattern and/or at least the part of the defective layer formed on the surface of the semiconductor wafer 200 are removed by wet etching (S301). Next, on at least one surface of the semiconductor wafer 200 from which the different material layer 210 and/or at least the part of the defective layer have been removed, a coating is applied with resist and so on to form the film 220 (step S304). After that, dry etching is performed by plasma on the surface of the semiconductor wafer 200 of the side of the formed film 220, together with the film 220 formed by the film formation (step S307). Through wet etching+resist film formation+dry etching, the semiconductor wafer 200 is reclaimed like an initial wafer.

In wet etching of the foregoing processing, the kind of wet etching cleaning varies according to the material layer 210 exfoliated by wet etching.

In the case of a poly-Si wafer, fluoro-nitric acid (HF, HNO$_3$, H$_2$O) cleaning is performed.

In the case of an Ox (with an oxide film) wafer, specifically a wafer with SiO$_2$, DHF (Dilute Hydro Fluoricacid) cleaning is performed.

In the case of a wafer having a pattern layer, it is desirable to perform wet etching in a wafer surface layer removing process after removal by grinding. Thus at least the part of the defective layer (grinding traces and the like during the grinding of the pattern layer of the semiconductor wafer) is removed by wet etching. The film 220 is formed on at least one surface of the semiconductor wafer 200 after the removal, and the surface of the semiconductor wafer 200 of the side of the formed film 220 is dry etched by plasma together with the film 220 formed by the film formation, so that the wafer can be reclaimed with high quality.

In the present embodiment, in the wafer surface layer removing process, grinding for removing the different material layer 210 and/or at least the part of the defective layer formed on the surface of the semiconductor wafer 200 is not performed immediately before resist film formation+dry etching of a wafer roughness finishing process. Thus no grinding traces occur and a mirror surface can be easily obtained. When the total grinding allowance of the wafer is 40 µm, the wafer is largely ground by about 10 µm during grinding, so that reclamation can be performed about four times. In wet etching, the wafer is less etched by about 4 µm (4000 nm). When wet etching is mainly used in the wafer surface layer removing process, reclamation can be performed about ten times (in dry etching, the wafer is etched by about 1 µm).

As previously mentioned in the third embodiment, in the wafer surface layer removing process, the different material layer 210 and/or at least the part of the defective layer formed on the surface of the semiconductor wafer 200 are removed by chemical removal using wet etching or chemical removal performed using wet etching after physical removal using grinding and the like. After that, the film 220 is formed on at least one surface of the semiconductor wafer 200 from which the different material layer 210 and/or at least the part of the defective layer have been removed, and the surface of the semiconductor wafer 200 of the side of the formed film 220 is dry etched by plasma together with the film 220 formed by the film formation. Thus the wafer can be reclaimed with high accuracy without performing CMP (chemical mechanical polishing) or the like which is a wafer roughness finishing method of polishing the wafer with high accuracy by physicochemical removal using a chemical solution containing abrasive grains in the wafer surface roughness finishing process.

Thus it is possible to eliminate a cleaning process in which abrasive grains are removed from the semiconductor wafer in response to polishing using a chemical solution containing abrasive grains in the wafer surface roughness finishing process, and eliminate the need for a cleaning solution used in the process and the discarding process of the cleaning solution. Consequently, it is possible to reduce the cost and reclaim the semiconductor wafer with a flat and clean surface. Moreover, the dry etching process can eliminate contamination and particles.

Thus by changing grinding in the wafer surface layer removing process of the first and second embodiments to chemical removal using wet etching or chemical removal performed using wet etching after physical removal is performed using grinding and the like, the following effects can be obtained:

Specifically, it is possible to suppress local roughness such as cut grooves on the surface of the semiconductor wafer 200 before resist film formation+dry etching in the wafer surface roughness finishing process and improve surface roughness Ra on the surface of the wafer before the wafer surface roughness finishing process as compared with grinding. Thus it is possible to reduce the number of times of resist film formation+drying etching in the wafer surface roughness finishing process.

Further, it is possible to reliably eliminate small grinding traces which cannot be eliminated even by resist film formation+dry etching, and obtain a mirror surface. In this case, the surface roughness Ra on the surface of the wafer is about Ra=20 Å-40 Å (2 nm to 4 nm) after wet etching in the wafer surface layer removing process. The film 220 is formed on at least one surface of the semiconductor wafer 200 after wet etching, and the surface of the semiconductor wafer 200 of the side of the formed film 220 is dry etched by plasma together with the film 220 formed by the film formation, so that the surface roughness can be Ra<10 Å (1 nm) on the surface of the semiconductor wafer 200.

Moreover, in the wafer surface layer removing process, wet etching can remove foreign matters having adhered to the surface of Si.

Unlike in grinding, local grooves are not formed, though waviness occurs over the wafer. Thus foreign matters do not adhere to local grooves later and the removal of foreign matters is not hampered.

It is therefore possible to reduce local roughness and particles on the surface of the wafer, achieving a reclaimed wafer of higher quality.

FIG. 12A shows a processing result of resist film formation+dry etching in smoothing of a Si wafer after grinding for removing the different material layer 210 on the surface of the wafer according to the first and second embodiments. FIG. 12A shows that the surface roughness Ra on the surface of the wafer is improved by performing resist film formation+dry etching twice as compared with one-time resist film formation+dry etching. FIG. 12B shows the etching conditions of resist film formation+dry etching at this point.

FIGS. 13A and 13B show the degree of dependence on the gas flow rate ratio of $SF_6/CF_4$ in the smoothing of the Si wafer after grinding. FIGS. 13A and 13B show that 100/0 is a favorable condition as a gas flow rate ratio of $SF_6/CF_4$. FIG. 13C shows other dry etching conditions when etching is performed at gas flow rate ratios of $SF_6/CF_4$ shown in FIGS. 13A and 13B.

FIG. 14A shows the relationship between the surface roughness Ra on the surface of the wafer and conditions for performing dry etching alone in the smoothing of the Si wafer during the wafer roughness finishing process after grinding, and the relationship between the surface roughness Ra on the surface of the wafer and the conditions of resist film formation+dry etching in the smoothing of the Si wafer in the wafer roughness finishing process after grinding. FIG. 14A shows the conditions of dry etching and FIG. 14B shows processing results on the surface of the wafer under the conditions of FIG. 14A. In this case, as indicated by No. 1 to No. 9 of FIG. 14A, the dry etching conditions are changed in various ways in drying etching performed alone. With dry etching alone, the surface roughness Ra on the surface of the semiconductor wafer 200 cannot be improved to the target surface roughness Ra (Ra<30 Å) of the first and second embodiments. As indicated by No. 10 in FIG. 14A, it is found that resist film formation+dry etching can remarkably improve the surface roughness Ra on the surface of the wafer from 111 Å to 31.5 Å, that is, from the state of No. 01 of FIG. 14B to the state of No. 10 of FIG. 14B.

Figures 15A, 15B:
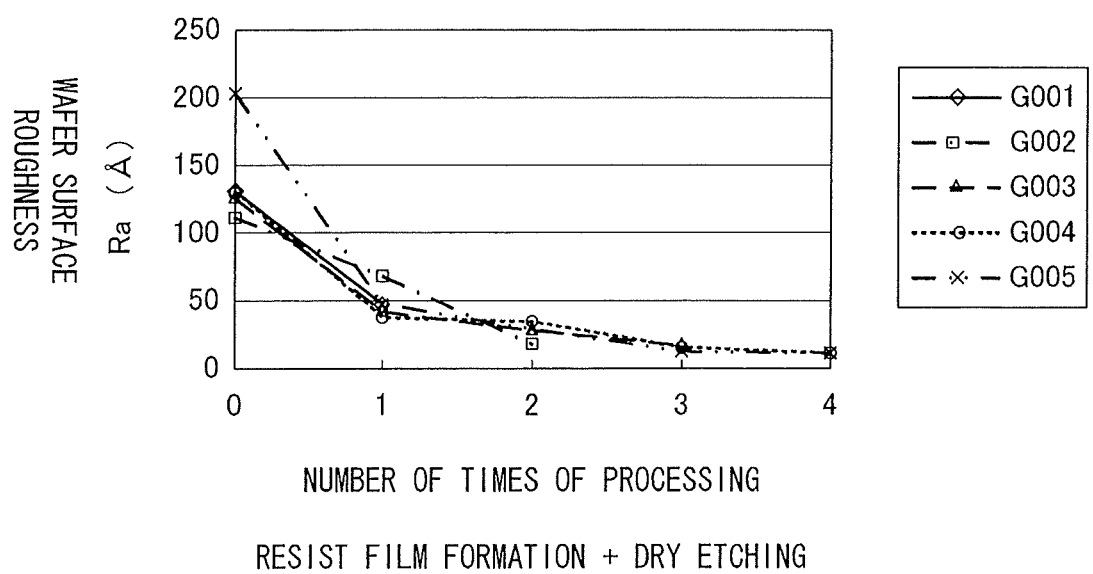
FIG. 15A is an explanatory drawing showing the relationship between the number of times of dry etching in the mirror finishing of the Si wafer and surface roughness Ra.
FIG. 15B is a graph showing the relationships of FIG. 15A.

FIGS. 15A and 15B show the relationship between the number of times of resist film formation+dry etching in the smoothing of the Si wafer during the wafer roughness finishing process after grinding and the surface roughness Ra on the wafer surface of the semiconductor wafer 200. FIG. 15A shows the relationships between the number of times of resist film formation+dry etching and the surface roughness Ra and FIG. 15B is a graph showing the relationships of FIG. 15A.

When the number of times of resist film formation+dry etching is increased, the surface roughness Ra on the surface of the wafer is improved to about 12 Å but grinding traces are visually confirmed on the surface of the wafer. According to measurements by a step profiler (KLA-Tencor Corporation), the surface roughness Ra on a grinding trace is hardly different from those of other portions on the surface of the reclaimed wafer.

The following will describe a wafer reclamation apparatus 400 for the wafer roughness finishing process (resist film formation+dry etching) according to the embodiments of the present invention with reference to the accompanying drawings.

FIG. 16A is a schematic diagram showing the configuration of the wafer reclamation apparatus according to the present embodiment. In FIG. 16A, reference character W (W1, W2) denotes a wafer (semiconductor wafer 200), reference characters K1 and K2 denote cassettes for storing the wafers W1 and W2, reference character TC1 denotes an atmospheric pressure transport section also acting as a centering section for positioning the wafer, reference characters A1 and A2 denote the arms of the atmospheric pressure transport section TC1 for transporting the wafers W1 and W2 to the cassettes K1 and K2, reference character S1 denotes an optical surface roughness measuring device for measuring the surface roughness Ra on the wafer surface of the wafer W, reference character SC1 denotes a spin coater chamber for coating the surface of the wafer W with a resist film by applying resist (not shown) to the surface of the wafer W in the atmosphere while rotating the wafer W about a rotation axis which is an axis perpendicular to the plane of the wafer W, reference character B1 denotes a baking chamber for drying, in the atmosphere, the resist film having been applied to the surface of the wafer 141, reference character LO1 denotes a load/lock (L/L) chamber for switching atmospheric pressure and a vacuum pressure, reference character E1 denotes a dry etching chamber for performing plasma etching with reactant gas under a vacuum pressure, reference character H1 denotes a transport section (for atmospheric pressure) which includes a double arm WA1 capable of transporting the wafer W1 under atmospheric pressure among the atmospheric pressure transport section/centering section TC1, the spin coater chamber SC1, the baking chamber B1, and the load/lock (L/L) chamber switched to atmospheric pressure, reference character H2 denotes a transport section (for a vacuum pressure) which includes a double arm WA2 capable of transporting the wafer W1 in a vacuum pressure between the etching chamber E1 and the load/lock (L/L) chamber switched to a vacuum pressure, WS denotes a wafer supply section of the semiconductor wafer 200, and reference character C1 denotes a control section which collectively controls these devices and controls a wafer reclamation operation including a film forming step of forming a film at least on one surface of the semiconductor wafer from which the different material layer and/or at least the part of the defective layer have been removed and a dry etching step of plasma etching the surface of the semiconductor wafer of the side of the formed film together with the film formed in the film forming step. In this configuration, the processing chambers may respectively include processing operation control sections and the control section C1 may collectively control the control sections provided in the processing chambers.

Figure 17A:
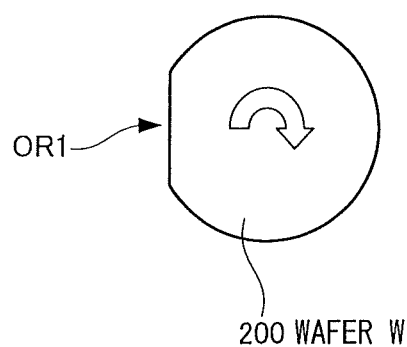
FIG. 17A is an explanatory drawing showing an example of a wafer positioning device in the wafer reclamation apparatus of the embodiment.
Figure 17B:
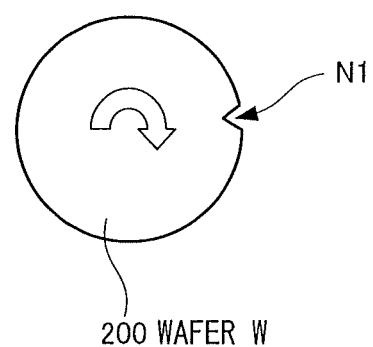
FIG. 17B is an explanatory drawing showing another example of a wafer positioning device in the wafer reclamation apparatus of the embodiment.

As shown in FIGS. 17A and 17B, the wafer W is positioned by detecting orientation flat OR1 or notch N1 of the wafer with the atmospheric pressure transport section/centering section TC1.

Figure 18:
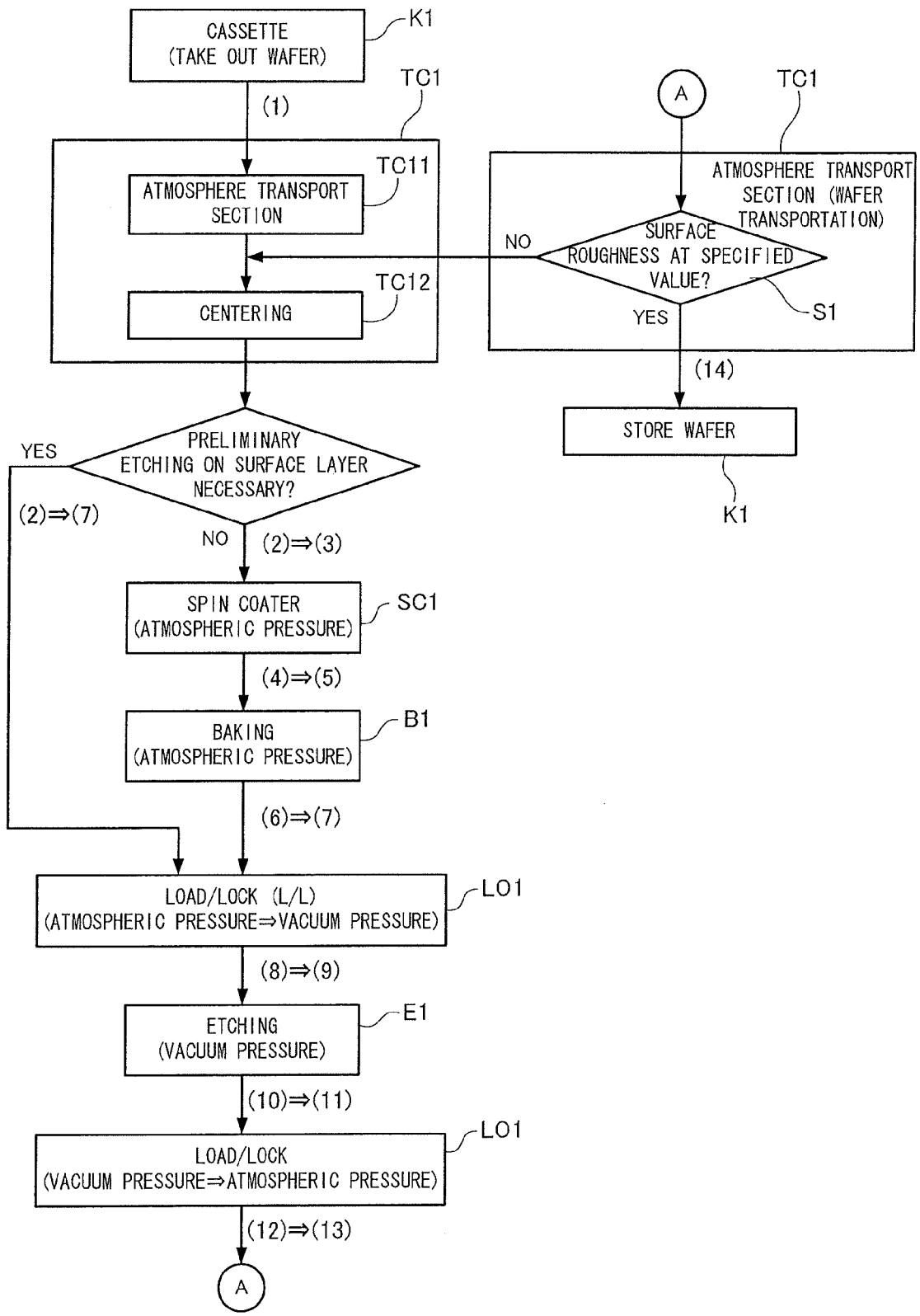
FIG. 18 is a flowchart showing operations in the wafer reclamation apparatus of the embodiment.

In the foregoing wafer reclamation apparatus 400, first, the wafer W (W1, W2) is taken out of the cassette K1 or K2 with the arms A1 and A2 of the atmospheric pressure transport section TC1 as indicated by the operation flowchart of the wafer reclamation apparatus 400 in FIG. 18. In the following explanation, it is assumed for simplification that the wafer W1 is taken out of the cassette K1 with the arm A1 of the atmospheric pressure transport section TC1.

The wafer W1 taken from the cassette K1 moves to the atmospheric pressure transport section/centering section TC1 (path (1)) and centering is performed to position the wafer W1. When preliminary dry etching is not necessary before the resist film is formed on the surface layer of the wafer W1, the wafer W1 is moved to the spin coater chamber SC1 with the double arm WA1 of the transport section (for atmospheric pressure) H1 and resist is applied to the surface of the wafer W1 to form the resist film (path (2) to (3)). Next, the wafer W1 is moved to the baking chamber B1 with the double arm WA1 of the transport section (for atmospheric pressure) H1 and is baked therein (path (4) to (5)). After that, the wafer W1 is moved to the load/lock (L/L) chamber LO1, which has been switched to atmospheric pressure, with the double arm WA1 of the transport section (for atmospheric pressure) H1 (path (6) to (7)) and the atmospheric pressure is switched to a vacuum pressure in the load/lock (L/L) chamber LO1. Next, the wafer W1 is moved to the etching chamber E1 through the transport section (for a vacuum pressure) H2 with the double arm WA2 of the transport section (for a vacuum pressure) H2 (path (8) to (9)) and the wafer W1 is etched. After that, the wafer W1 is moved to the load/lock (L/L) chamber LO1, which has been switched to a vacuum pressure, through the transport section (for a vacuum pressure) H2 with the double arm WA2 of the transport section (for a vacuum pressure) H2 (path (10) to (11)) and the vacuum pressure is switched to atmospheric pressure in the load/lock (L/L) chamber LO1. Next, the wafer W1 is transported by moving the wafer W to the atmospheric pressure transport section TC1 with the double arm WA1 of the transport section (for atmospheric pressure) H1 (path (12) to (13)). After that, when it is found that the surface roughness Ra on the surface of the wafer W1 is equal to a specified value as a result of an inspection of the optical surface roughness measuring device S1 provided in the atmospheric pressure transport section TC1, the wafer W1 is stored in the cassette K1 with the arm A1 (path (14)).

On the other hand, the wafer W1 is taken out of the cassette K1 with the arm A1 of the atmospheric pressure transport section TC1 and is moved to the atmospheric pressure transport section/centering section TC1 (path (1)). When preliminary etching on a surface layer is determined to be necessary, the wafer W1 is directly moved to the load/lock chamber LO1, which has been switched to atmospheric pressure, with the double arm WA1 of the transport section (for atmospheric pressure) H1 (path (2) to (7)). In this case, the explanation of the flow of movement of the wafer W after the load/lock chamber LO1 is omitted because the flow of movement is similar to the operation flow in the case where preliminary etching on the surface layer is determined to be unnecessary.

Further, in the atmospheric pressure transport section TC1, when an inspection conducted by the optical surface roughness measuring device S1 proves that the surface roughness Ra on the surface of the wafer W1 is not equal to the specific value, the wafer W1 is moved from the centering section TC1 to the spin coater chamber SC1 with the double arm WA1 of the transport section (for atmospheric pressure) H1 (path (2) to (3)) and resist is applied again to the surface of the wafer W1 to form a resist film. After that, processing from path (4) to (13) is performed. Resist film formation+dry etching is repeated until the surface roughness Ra on the surface of the wafer W1 reaches the specified value.

Through the foregoing operation steps, the wafer W is reclaimed like an initial wafer.

In the foregoing explanation, the optical surface roughness measuring device S1 is provided in the atmospheric pressure transport section TC1. The optical surface roughness measuring device S1 may be provided in the transport section (for atmospheric pressure) H1. Thus the surface roughness Ra on the surface of the wafer W can be measured without transporting the wafer W to the atmospheric pressure transport section TC1, so that the wafer W can be moved to the spin coater chamber SC1 again when the surface roughness Ra is not equal to the specified value.

To the steps performed in the wafer reclamation apparatus 400, for example, the wafer W1 is transported as follows: the double arm WA1 of the transport section H1 (for atmospheric pressure) simultaneously transports the wafer W from the baking chamber B1 to the load/lock chamber (L/L chamber) LO1 (path (5) to (7)) and from the load/lock chamber (L/L chamber) LO1 to the atmospheric pressure transport section/centering section TC1 (path (12) to (13)).

Next, the double arm WA1 can simultaneously transport the wafer W from the atmospheric pressure transport section/centering section TC1 to the spin coater chamber SC1 (path (2) to (3)) and from the spin coater chamber SC1 to the baking chamber B1 (path (4) to (5)), thereby reducing the time of transportation of the wafer to the processing chambers or the time of transportation to the steps. By increasing the number of wafer transport arms, more wafers can be transported at the same time.

In the event of wafer processing standby time for the subsequent process, a wafer standby position may be provided. Further, the transport sections (H1, H2) configured separately for atmospheric pressure and a vacuum pressure and the load/lock chamber (L/L) chamber LO1 for switching atmospheric pressure and a vacuum pressure are configured in different spaces, so that the wafer W1 is transported from an atmospheric pressure region to a vacuum pressure region by dedicated transport devices separately configured as the transport section (for atmospheric pressure) H1 and the transport section (for a vacuum pressure) H2. For this reason, even when the double arm WA1 of the transport section H1 for atmospheric pressure is contaminated by resist scattering in the spin coater chamber SC1 for rotating the wafer W1 to apply the resist to the surface of the wafer W1, the transport arm WA1 for atmospheric pressure is not directly placed in the etching chamber E1 for performing dry etching in a vacuum pressure with reactant gas, thereby suppressing dust contamination into the etching chamber E1.

Since the transport sections (H1, H2) are configured specifically for atmospheric pressure and a vacuum pressure, the load/lock chamber (L/L chamber) LO1 and the transport sections (H1, H2) are configured in different spaces and it is not necessary to directly switch atmospheric pressure and the atmosphere of a vacuum pressure in the spaces of the transport sections requiring large spaces for the double arm mechanisms and so on. Thus it is possible to reduce the size of the load/lock chamber (L/L chamber) LO1 and shorten processing time for switching atmospheric pressure and a vacuum pressure in the load/lock chamber (L/L chamber) LO1.

The wafer W1 can be transported to the etching chamber E1 in the atmosphere of a vacuum pressure, in parallel to at least one of the spin coater chamber SC1 for applying the resist to the surface of the wafer W1 under atmospheric pressure, the baking chamber B1 for drying the resist film applied to the surface of the wafer W1 in the atmosphere of atmospheric pressure, and the atmospheric pressure transport section/centering section TC1. Thus the productivity can improve even in switching between a vacuum pressure and atmospheric pressure.

With this configuration of the wafer reclamation apparatus 400 for performing the wafer roughness finishing process (resist film formation+dry etching), the resist application of the spin coater chamber SC1, the post baking of the baking chamber B1, and the dry etching of the dry etching chamber E1 can be performed in-line.

Further, the baking chamber B1 may perform thermal baking with a hot plate and the like or baking with light (UV) and the like.

In the case of baking with light, baking can be performed with light during transportation by using, for example, a UV lamp attached to the top surface of the transport path of the transport section H1 and so on.

Moreover, the optical surface roughness measuring device S1 for measuring the surface roughness Ra on the surface of the wafer W may be an optical microscope and the like.

For comparison, the following will describe another wafer reclamation apparatus in which the resist formation process and etching process of the wafer roughness finishing process are configured by different devices and are performed as batch processing.

Figure 19:
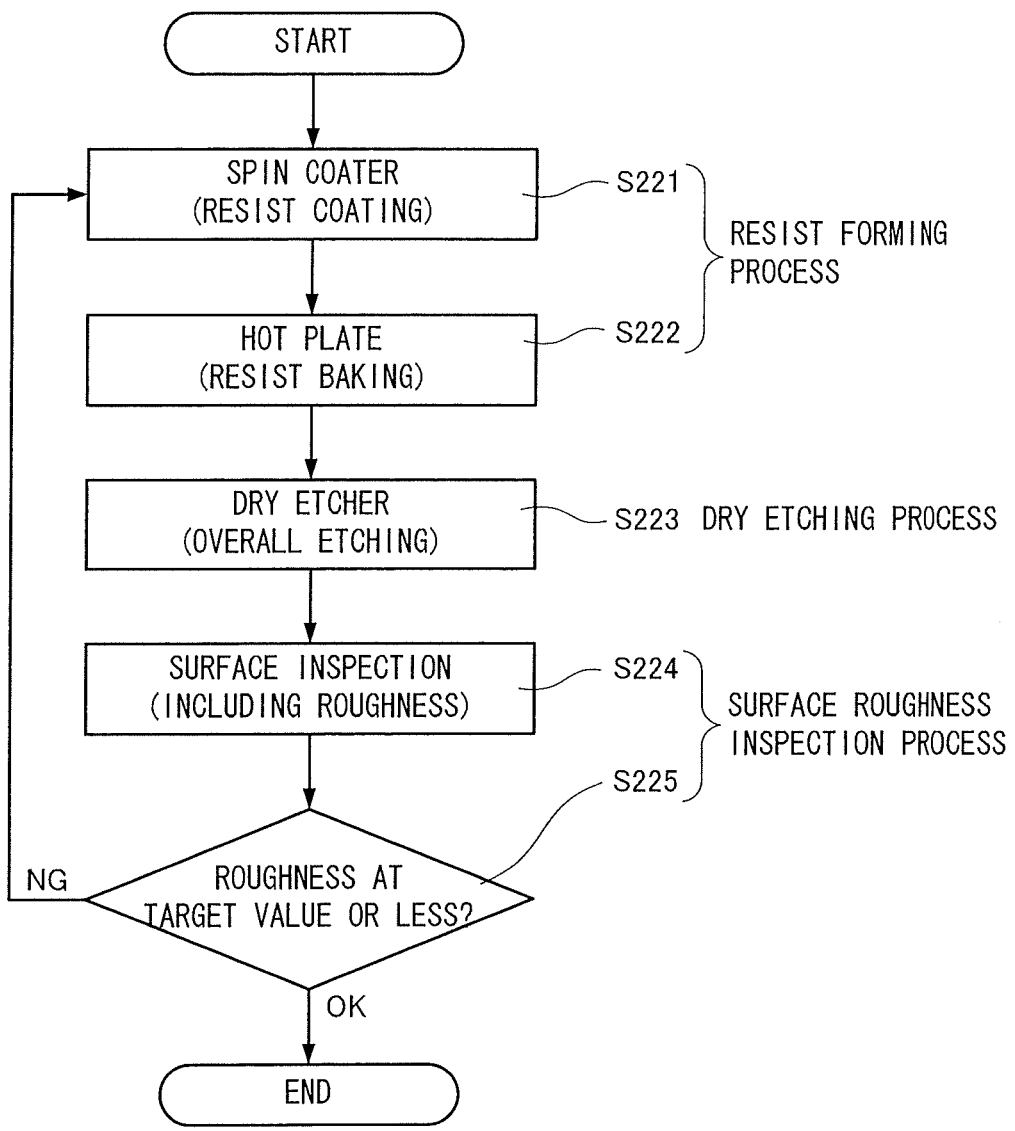
FIG. 19 is a flowchart showing the processing of the wafer reclamation apparatus when a resist forming process and an etching process, which belong to the wafer surface roughness finishing process, are configured by different devices.

FIG. 19 is a flowchart showing the configuration and processing steps of the wafer reclamation apparatus. As shown in FIG. 19, first, the semiconductor wafer 200 is rotated about a rotation axis, which is an axis perpendicular to the plane of the semiconductor wafer 200, by a spin coater in a resist formation process; meanwhile, resist (not shown) serving as an example of the film 220 formed on the surface of the semiconductor wafer 200 is applied to the surface of the semiconductor wafer 200 to apply a coating of resist (step S221). The film 220 (resist) applied to the surface of the semiconductor wafer 200 is subjected to resist baking by a hot plate (step S222), and then the surface of the semiconductor wafer 200 of the side of the formed film 220 is dry etched together with the film 220 by a dry etcher which is a separate device for a dry etching process (step S223). Next, a surface inspection is conducted on surface roughness Ra and TTV on the surface of the semiconductor wafer 200 by a surface analyzer for a surface inspection process (step S224). As a result of the inspection, when the surface roughness Ra on the surface of the semiconductor wafer 200 is satisfactory (Yes in step S225), the wafer reclamation is completed. When the surface roughness Ra on the surface of the wafer is not satisfactory (No in step S225), processing after the resist coating by the spin coater is repeated. When the surface roughness Ra on the surface of the semiconductor wafer 200 finally becomes satisfactory (Yes in step S225), the wafer reclamation is completed.

In the wafer reclamation apparatus, separate devices for resist coating and resist baking are necessary for the resist formation process and a dry etching device is necessary for the dry etching process, so that different devices are necessary for batch processing in each processing of the processing steps (the same device may be used for resist coating and baking). Since the semiconductor wafer 200 is temporarily transported out of the processing apparatus, foreign matters are likely to adhere to the surface of the semiconductor wafer 200. Thus the foreign matters (particles) having adhered to the surface may cause abnormal dry etching (including a point where etching locally speeds up, the occurrence of residues, and an abnormally etched shape), the surface roughness Ra on the finished surface of the semiconductor wafer 200 may be worsened because a change in the quality of the resist film due to aging and atmospheric pressure may change a selection ratio of the resist and silicon, and other problems may arise.

In dry etching of the foregoing embodiments, the following method can be carried out.

The method may be carried out such that a selection ratio of a coating film on the surface of the semiconductor wafer 200 and the semiconductor wafer 200 (Si) during dry etching is changed to a different dry etching condition when the coating film is dry etched to expose at least a part of the surface of the substrate of the semiconductor wafer 200 (Si).

As resist used in the foregoing embodiments, for example, "OFPR5000LB" and so on of TOKYO OHKA KOGYO CO., LTD. are available. The used resist is not particularly limited and other kinds of resist may be used as long as a selection ratio to Si is close to 1 during dry etching.

Regarding the film 220 formed on the surface of the semiconductor wafer 200, the materials of an organic film to be formed specifically include resist materials such as a photoresist, a screen printing resist, an etching resist, a plating resist, and a solder resist, polyimide, and acrylic resin (PMMA). Alternatively, various thermosetting resins and light curable resins may be used.

Further, an inorganic film material may be used. An inorganic material may be contained as a filler and the like in an organic material. Particularly, an organic material in which an inorganic material is added as a filler is preferable because a selection ratio to the material of the semiconductor wafer 200 can be adjusted by an amount of the filler.

The method of forming the film 220 on the surface of the semiconductor wafer 200 is not particularly limited. To be specific, the method includes a spin coating method, a mist method, an ink jet method, and a slit coating method. Further, the film 220 may be formed as necessary by CVD (Chemical Vapor Deposition) and PVD (Physical Vapor Deposition).

Moreover, the method can be carried out such that the coating film has a laminated structure of multiple layers.

The method of applying a coating on the surface of the wafer can be carried out similarly to, for example, a method of forming a polymerized film by plasma processing. Alternatively, the method may be carried out so as to bond tape and the like with a flexible film on the back side.

Moreover, in order to increase flatness on the coating surface of the wafer, the coating method can be carried out so as to add several coating films.

Further, the method can be carried out so as to apply a coating and perform dry etching on the surface of the wafer after the altered layer 205 on the surface of the wafer (Si) is removed by etching.

Industrial Applicability

The present invention is considered usable in the field of manufacturing of semiconductor devices.

The invention claimed is:

1. A wafer reclamation method in which a semiconductor wafer is reclaimed by removing a different material layer and/or at least a part of a defective layer formed on a surface of the semiconductor wafer, the method comprising:
   a physically removing step of physically removing the different material layer and/or at least the part of the defective layer from the semiconductor wafer;
   a preliminary dry etching step of directly plasma etching the surface of the semiconductor wafer from which the different material layer and/or at least the part of the defective layer have been removed in the physically removing step;
   a film forming step of forming a film on the surface of the semiconductor wafer etched in the preliminary dry etching step; and
   a dry etching step of plasma etching the surface of the semiconductor wafer under the film together with the film formed in the film forming step,
   wherein in the film forming step, the film is formed on the surface of the semiconductor wafer, and then in the dry etching step, the surface of the semiconductor wafer under the film is etched together with the film formed on the surface of the semiconductor wafer.

2. The wafer reclamation method according to claim 1, wherein in the film forming step, a polymerized film is formed as the film by plasma processing.

3. The wafer reclamation method according to claim 2, wherein gas for forming the film by plasma processing is gas containing one of $C_4F_8$, $CHF_3$, and hydrocarbon containing at least one of $CH_4$ and $C_2H_6$, or mixed gas containing at least one of $C_4F_8$, $CHF_3$, and hydrocarbon.

4. A wafer reclamation method in which a semiconductor wafer is reclaimed by removing a different material layer and/or at least a part of a defective layer formed on a surface of the semiconductor wafer,
the method comprising:
a physically removing step of physically removing the different material layer and/or at least the part of the defective layer from the semiconductor wafer;
a film forming step of forming a film on the surface of the semiconductor wafer from which the different material layer and/or at least the part of the defective layer have been removed in the physically removing step; and
a dry etching step of plasma etching the surface of the semiconductor wafer under the film together with the film formed in the film forming step,
wherein in the film forming step, the film is formed on the surface of the semiconductor wafer, and then in the dry etching step, the surface of the semiconductor wafer under the film is etched together with the film formed on the surface of the semiconductor wafer, and
the film forming step and the dry etching step are repeated until the semiconductor wafer has surface roughness (Ra) not higher than predetermined roughness.

5. The wafer reclamation method according to claim 4, wherein in the film forming step, a polymerized film is formed as the film by plasma processing.

6. The wafer reclamation method according to claim 5, wherein gas for forming the film by plasma processing is gas containing one of $C_4F_8$, $CHF_3$, and hydrocarbon containing at least one of $CH_4$ and $C_2H_6$, or mixed gas containing at least one of $C_4F_8$, $CHF_3$, and hydrocarbon.

7. A wafer reclamation method in which a semiconductor wafer is reclaimed by removing a different material layer and/or at least a part of a defective layer formed on a surface of the semiconductor wafer,
the method comprising:
a chemically removing step of removing the different material layer and/or at least the part of the defective layer from the semiconductor wafer by wet etching;
a film forming step of forming a film on at least one surface of the semiconductor wafer from which the different material layer and/or at least the part of the defective layer have been removed in the chemically removing step; and
a dry etching step of plasma etching the surface of the semiconductor wafer under the film together with the film formed in the film forming step,
wherein in the film forming step, the film is formed on the surface of the semiconductor wafer, and then in the dry etching step, the surface of the semiconductor wafer under the film is etched together with the film formed on the surface of the semiconductor wafer, and
the film forming step and the dry etching step are repeated until the semiconductor wafer has surface roughness (Ra) not higher than predetermined roughness.

8. The wafer reclamation method according to claim 7, wherein in the film forming step, a polymerized film is formed as the film by plasma processing.

9. The wafer reclamation method according to claim 8, wherein gas for forming the film by plasma processing is gas containing one of $C_4F_8$, $CHF_3$, and hydrocarbon containing at least one of $CH_4$ and $C_2H_6$, or mixed gas containing at least one of $C_4F_8$, $CHF_3$, and hydrocarbon.

* * * * *